(12) United States Patent
Kim et al.

(10) Patent No.: US 11,940,636 B2
(45) Date of Patent: Mar. 26, 2024

(54) DECORATION MEMBER

(71) Applicant: LG CHEM, LTD., Seoul (KR)

(72) Inventors: Yong Chan Kim, Daejeon (KR); Ki Hwan Kim, Daejeon (KR); Nansra Heo, Daejeon (KR); Jeong Woo Shon, Daejeon (KR); Pilsung Jo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 909 days.

(21) Appl. No.: 16/966,167

(22) PCT Filed: Jun. 14, 2019

(86) PCT No.: PCT/KR2019/007240
§ 371 (c)(1),
(2) Date: Jul. 30, 2020

(87) PCT Pub. No.: WO2019/240552
PCT Pub. Date: Dec. 19, 2019

(65) Prior Publication Data
US 2021/0037947 A1 Feb. 11, 2021

(30) Foreign Application Priority Data

Jun. 15, 2018 (KR) .................. 10-2018-0069234
Oct. 31, 2018 (KR) .................. 10-2018-0132090

(51) Int. Cl.
G02B 5/04 (2006.01)
B32B 15/20 (2006.01)
(Continued)

(52) U.S. Cl.
CPC .............. *G02B 5/045* (2013.01); *B32B 15/20* (2013.01); *C03C 17/245* (2013.01); *C08J 7/0423* (2020.01); *C23C 14/0036* (2013.01); *G02B 5/003* (2013.01); *G02B 5/26* (2013.01); *G02B 5/285* (2013.01); *A45D 33/18* (2013.01); *A45D 34/00* (2013.01); *A45D 2034/007* (2013.01); *A45D 40/00* (2013.01); *A45D 2040/0012* (2013.01); *B29C 45/26* (2013.01);
(Continued)

(58) Field of Classification Search
None
See application file for complete search history.

(56) References Cited

U.S. PATENT DOCUMENTS 6,157,489 A   12/2000   Bradley, Jr. et al.
6,236,510 B1   5/2001   Bradley, Jr. et al.
(Continued)

FOREIGN PATENT DOCUMENTS

CN   1345274 A   4/2002
CN   1630587 A   6/2005
(Continued)

Primary Examiner — Robert E. Tallman
(74) Attorney, Agent, or Firm — Bryan Cave Leighton Paisner LLP

(57) ABSTRACT

The present disclosure relates to a decoration member comprising: a color expression layer comprising a light reflection layer and a light absorption layer provided on the light reflection layer; and a substrate provided on one surface of the color expression layer, in which the light absorption layer comprises a copper nickel oxide ($Cu_aNi_bO_x$).

14 Claims, 19 Drawing Sheets

(51) Int. Cl.

| | |
|---|---|
| *C03C 17/245* | (2006.01) |
| *C08J 7/04* | (2020.01) |
| *C23C 14/00* | (2006.01) |
| *G02B 5/00* | (2006.01) |
| *G02B 5/26* | (2006.01) |
| *G02B 5/28* | (2006.01) |
| *A45D 33/18* | (2006.01) |
| *A45D 34/00* | (2006.01) |
| *A45D 40/00* | (2006.01) |
| *B29C 45/26* | (2006.01) |
| *B32B 15/082* | (2006.01) |

(52) U.S. Cl.
CPC .... *B29K 2901/12* (2013.01); *B29K 2995/002* (2013.01); *B32B 15/082* (2013.01); *B32B 2307/4023* (2013.01); *B32B 2307/416* (2013.01); *B32B 2311/04* (2013.01); *B32B 2311/08* (2013.01); *B32B 2311/18* (2013.01); *B32B 2311/22* (2013.01); *B32B 2311/24* (2013.01); *B32B 2439/00* (2013.01); *C03C 2217/72* (2013.01); *C03C 2218/155* (2013.01); *C08J 2367/02* (2013.01)

(56) References Cited

U.S. PATENT DOCUMENTS

| | | |
|---|---|---|
| 6,602,578 B1 | 8/2003 | Tompkin et al. |
| 6,686,042 B1 | 2/2004 | LeGallee |
| 6,797,366 B2 | 9/2004 | Hanson et al. |
| 7,037,594 B2 | 5/2006 | Kojima et al. |
| 7,923,122 B2 | 4/2011 | Korechika et al. |
| 8,287,994 B2 | 10/2012 | Fukawa et al. |
| 9,903,989 B2 | 2/2018 | Kim et al. |
| 2004/0013805 A1 | 1/2004 | Nagata et al. |
| 2005/0063067 A1 | 3/2005 | Phillips et al. |
| 2005/0127663 A1 | 6/2005 | Heim |
| 2008/0206495 A1 | 8/2008 | Korechika et al. |
| 2010/0128204 A1 | 5/2010 | Omote et al. |
| 2011/0177300 A1 | 7/2011 | Hankey et al. |
| 2011/0273356 A1 | 11/2011 | Kawaguchi et al. |
| 2013/0251947 A1 | 9/2013 | Lazarev |
| 2015/0192897 A1 | 7/2015 | Schilling et al. |
| 2015/0212244 A1* | 7/2015 | Kim .............. C23C 28/34 204/192.28 |
| 2016/0052227 A1 | 2/2016 | Takihara et al. |
| 2017/0052295 A1 | 2/2017 | Sakuma et al. |
| 2017/0307795 A1 | 10/2017 | Hankey et al. |
| 2018/0033893 A1 | 2/2018 | Lee et al. |
| 2018/0046017 A1 | 2/2018 | Lee et al. |
| 2018/0267638 A1 | 9/2018 | Yoon et al. |
| 2019/0161847 A1* | 5/2019 | Ready ............... H01M 50/562 |
| 2019/0302317 A1 | 10/2019 | Jones et al. |
| 2020/0062027 A1 | 2/2020 | Shon et al. |
| 2020/0114621 A1 | 4/2020 | Kim et al. |
| 2021/0016540 A1 | 1/2021 | Jo et al. |

FOREIGN PATENT DOCUMENTS

| | | |
|---|---|---|
| CN | 101249773 A | 8/2008 |
| CN | 102725663 A | 10/2012 |
| CN | 202518003 U | 11/2012 |
| CN | 104245884 A | 12/2014 |
| CN | 104602909 A | 5/2015 |
| CN | 104903117 A | 9/2015 |
| CN | 107112075 A | 8/2017 |
| CN | 107521251 A | 12/2017 |
| CN | 111683562 A | 9/2020 |
| DE | 102016007649 A1 | 12/2017 |
| EP | 2420391 A2 | 2/2012 |
| EP | 3 725 516 A1 | 10/2020 |
| GB | 1 234 079 A | 6/1971 |
| JP | H03-254943 A | 11/1991 |
| JP | 2002530712 A | 9/2002 |
| JP | 2005516829 A | 6/2005 |
| JP | 2008-238599 A | 10/2008 |
| JP | 2008229997 A | 10/2008 |
| JP | 2009-80205 A | 4/2009 |
| JP | 4304001 B2 | 7/2009 |
| JP | 2009168928 A | 7/2009 |
| JP | 2010-173273 A | 8/2010 |
| JP | 2010173273 A | 8/2010 |
| JP | 2010-197798 A | 9/2010 |
| JP | 2010188713 A | 9/2010 |
| JP | 2011-005682 A | 1/2011 |
| JP | 2011173379 A | 9/2011 |
| JP | 2013515285 A | 5/2013 |
| JP | 2015068849 A | 4/2015 |
| JP | 2016218913 A | 12/2016 |
| JP | 2017-205959 A | 11/2017 |
| KR | 10-2003-0007056 A | 1/2003 |
| KR | 10-2008-0078523 A | 8/2008 |
| KR | 10-2010-0135837 A | 12/2010 |
| KR | 10-2014-0029333 A | 3/2014 |
| KR | 10-2016-0085132 A | 7/2016 |
| KR | 1020170133109 A | 12/2017 |
| KR | 10-2018-0101989 A | 9/2018 |
| TW | 201022051 A | 6/2010 |
| TW | 201600901 A | 1/2016 |
| WO | 00/31571 A1 | 6/2000 |
| WO | 2000/043565 A1 | 7/2000 |
| WO | 2002/024818 A1 | 3/2002 |
| WO | 2009008403 A1 | 1/2009 |
| WO | 2016137282 A1 | 9/2016 |
| WO | 2016159602 A1 | 10/2016 |
| WO | 2017214007 A1 | 12/2017 |
| WO | 2018030355 A1 | 2/2018 |
| WO | 2018/164464 A1 | 9/2018 |
| WO | 2019004722 A1 | 1/2019 |

\* cited by examiner

[FIG. 1]
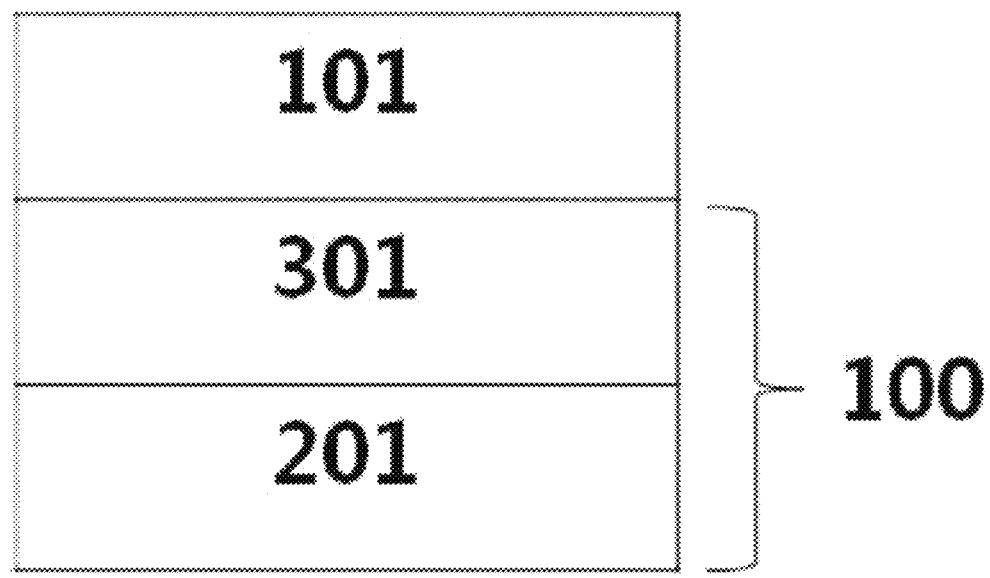
[FIG. 2]
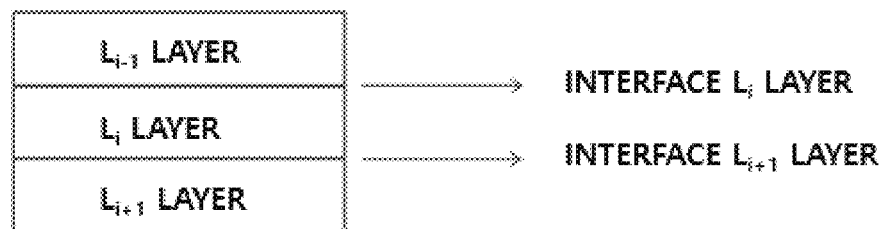

[FIG. 3]
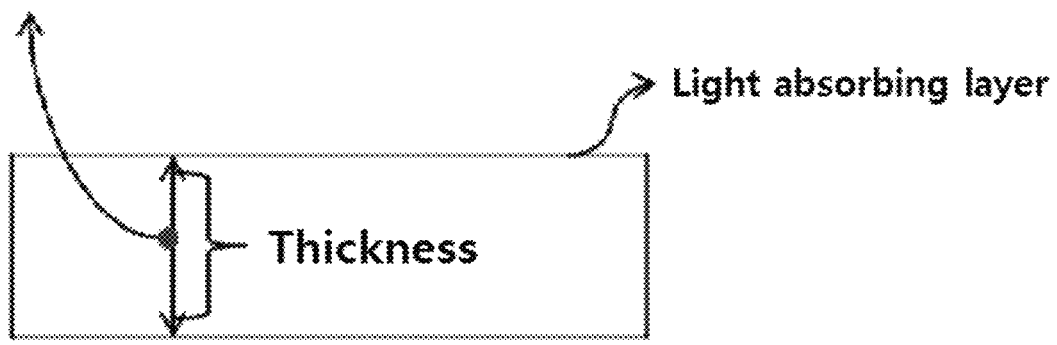
[FIG. 4]
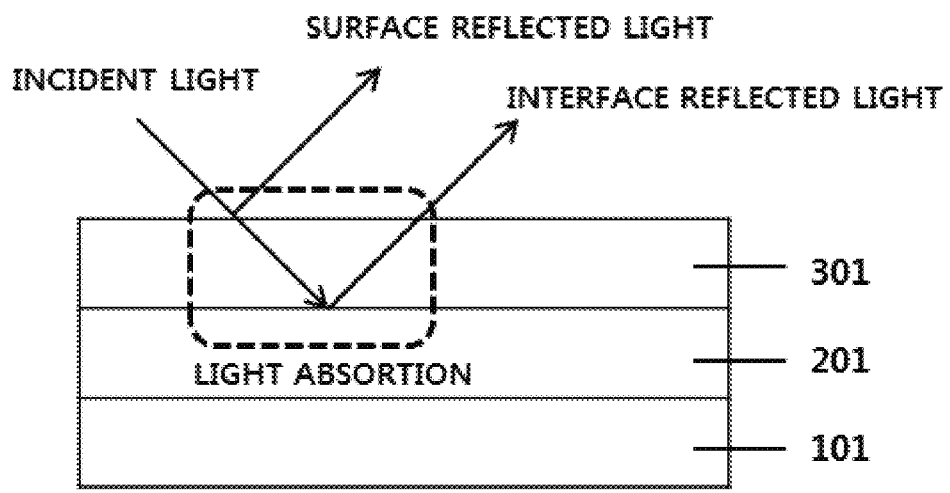
[FIG. 5]
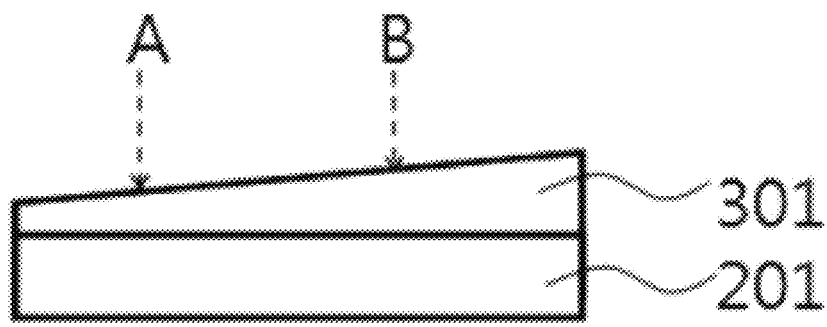

[FIG. 6]
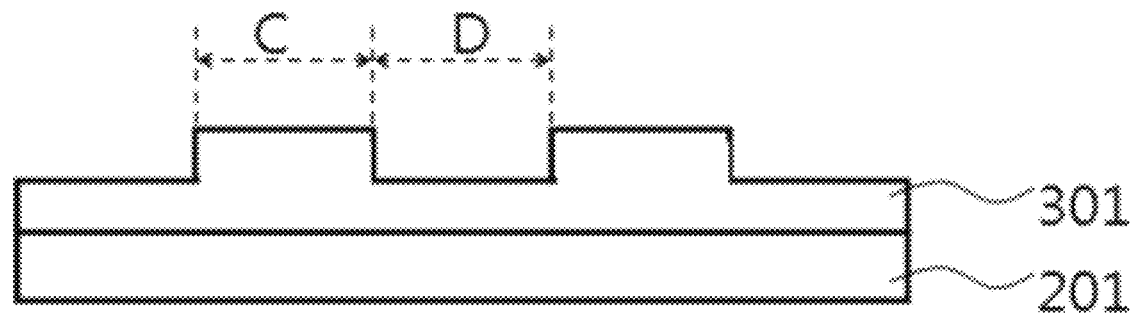
[FIG. 7]
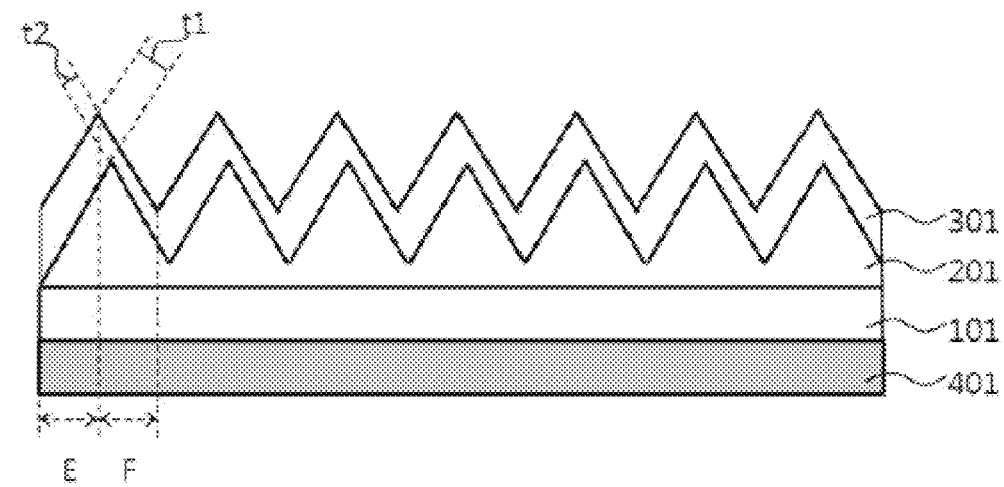
[FIG. 8]
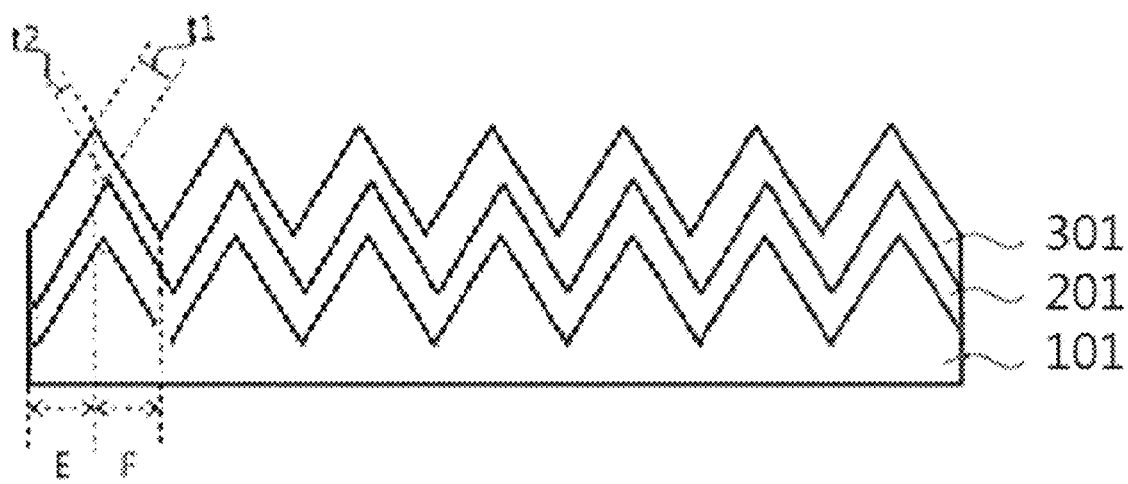

[FIG. 9]
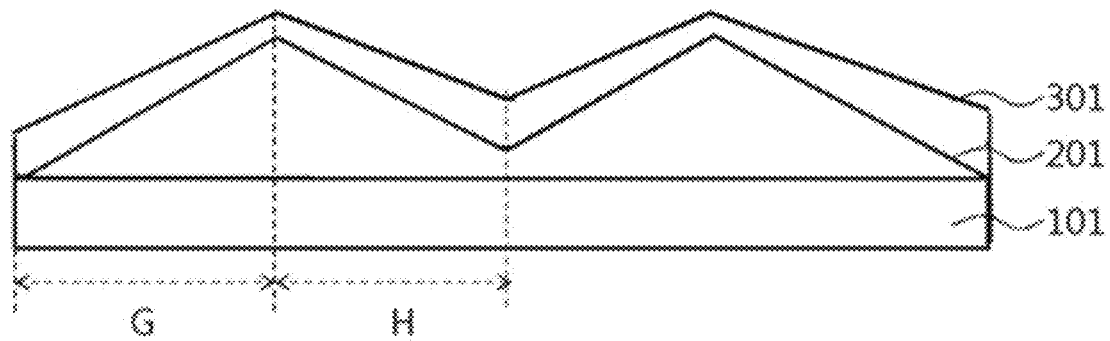
[FIG. 10]
(a) Observing Direction
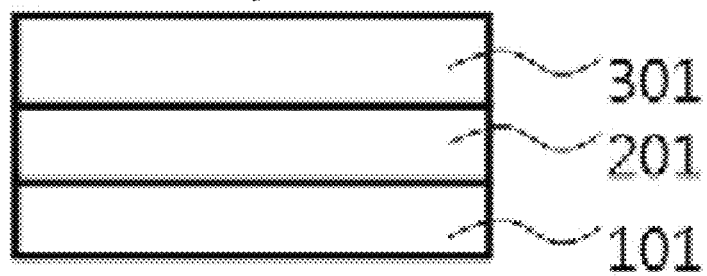
(b) Observing Direction
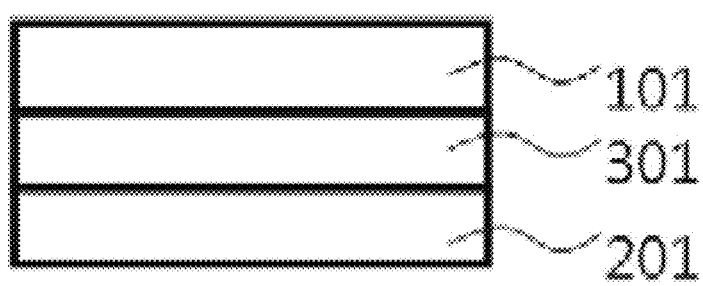

[FIG. 11]
(a) Observing Direction
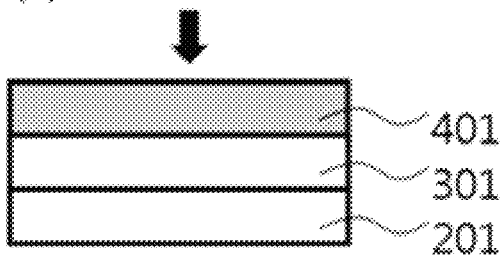
401
301
201
(b) Observing Direction
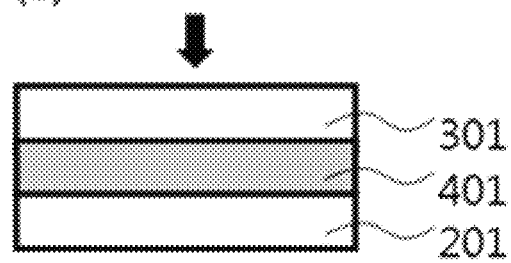
301
401
201
(c) Observing Direction
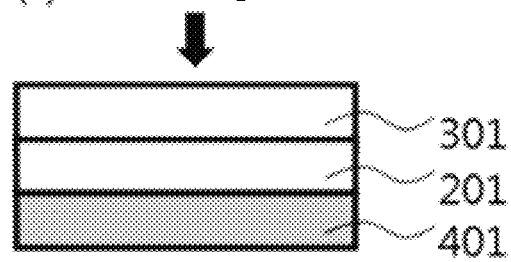
301
201
401

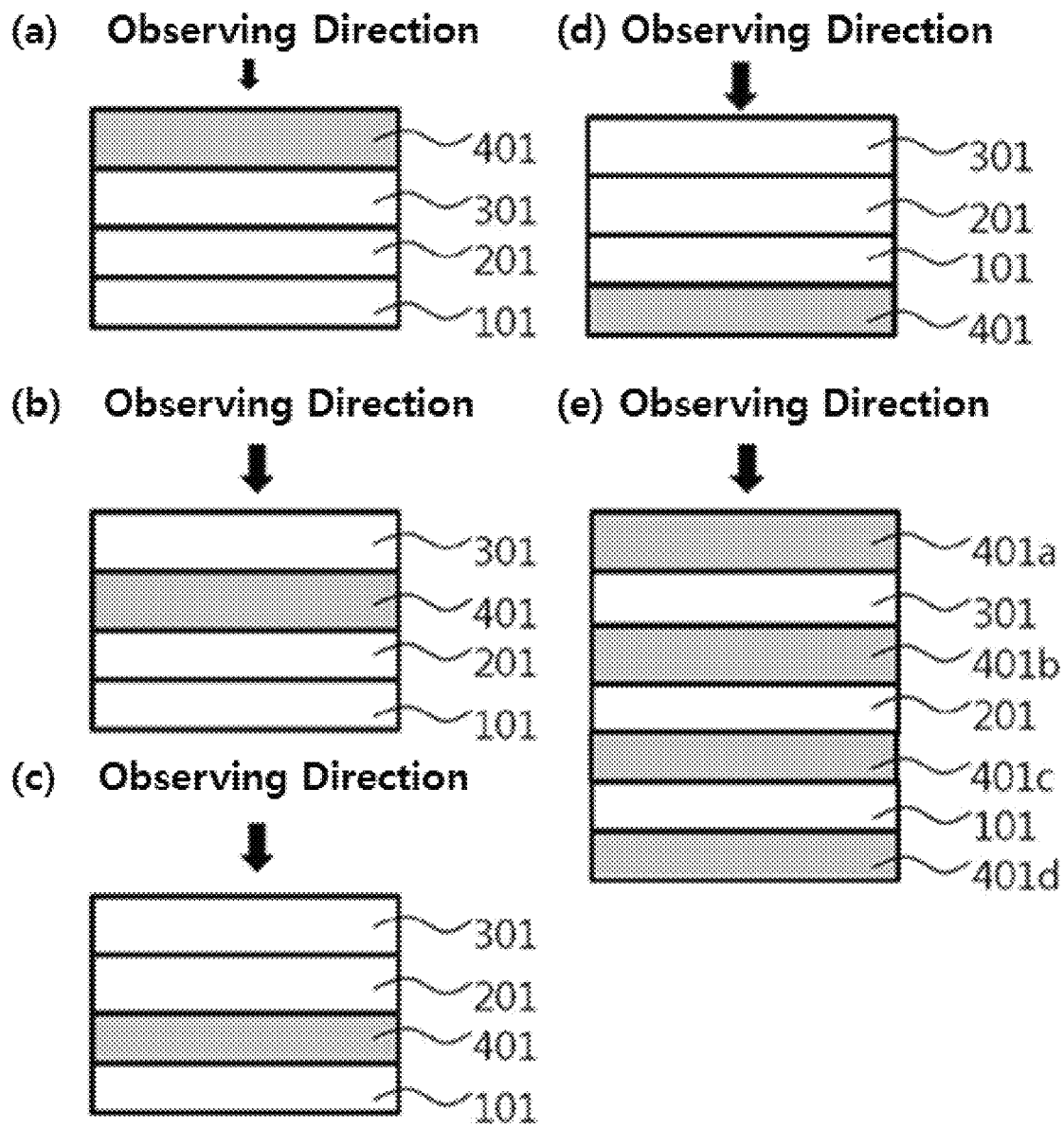

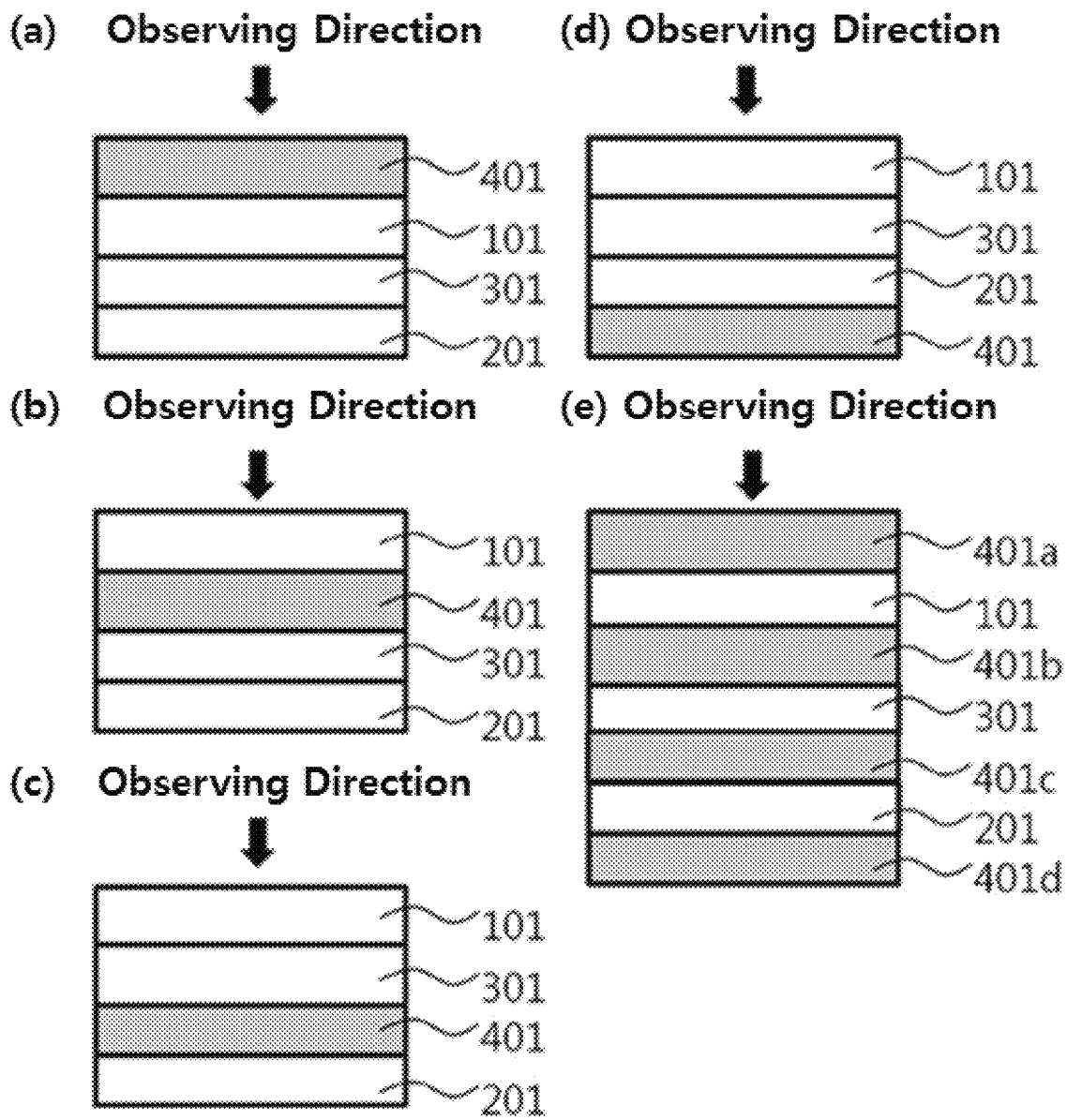
[FIG. 13]

[FIG. 14]
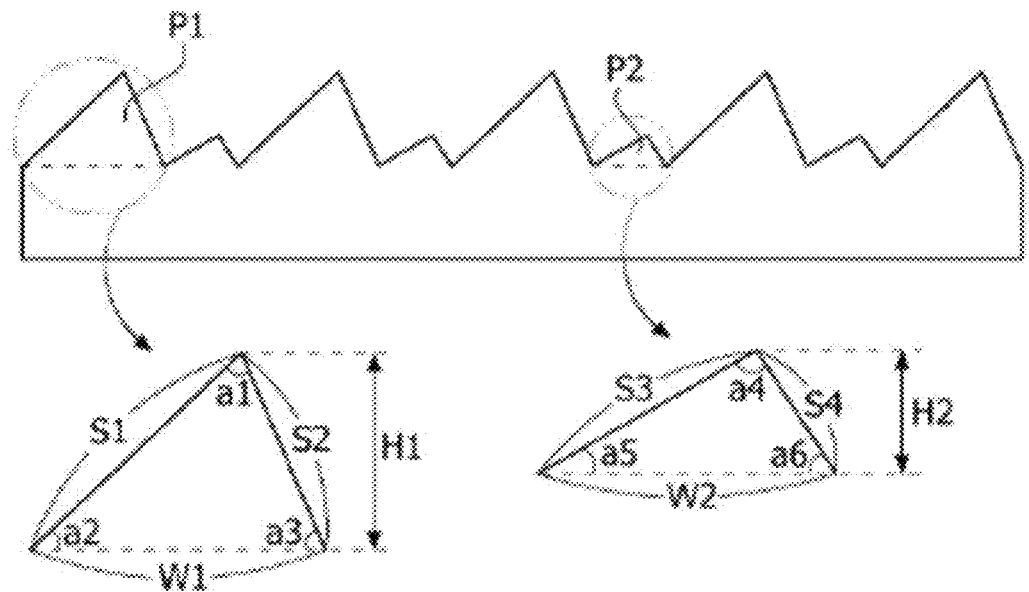
[FIG. 15]
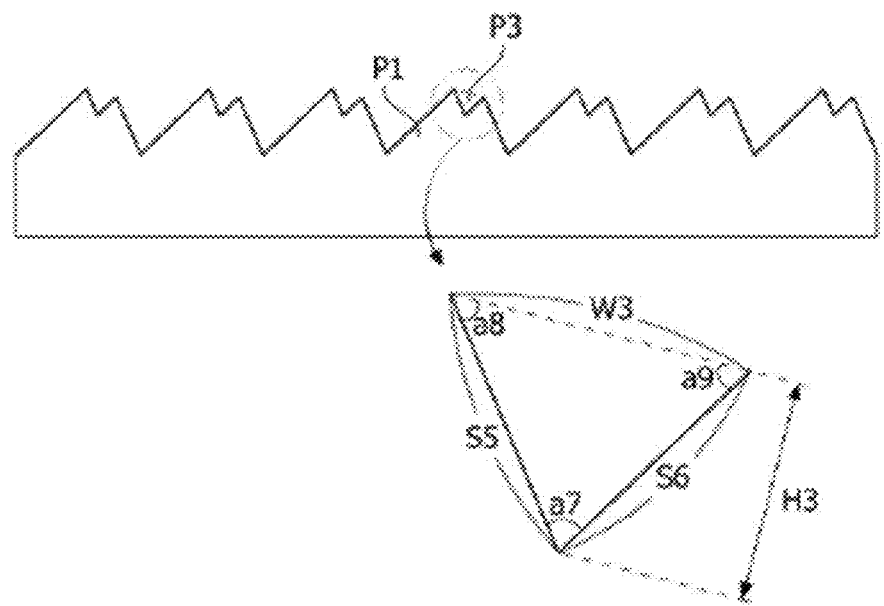

[FIG. 16]
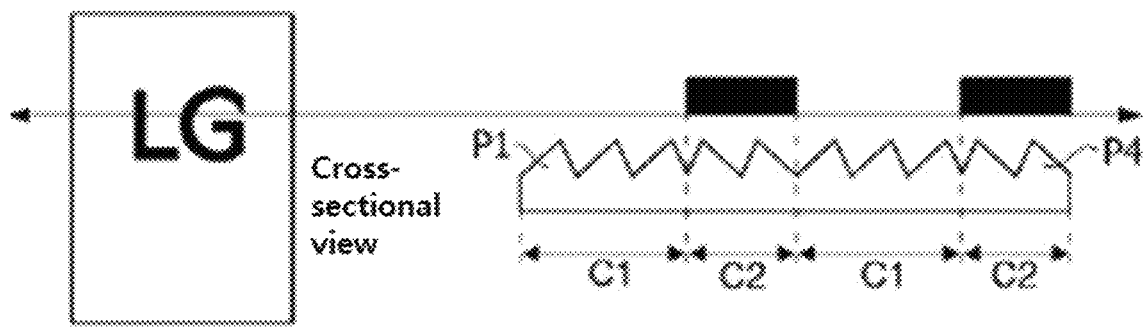
(a)
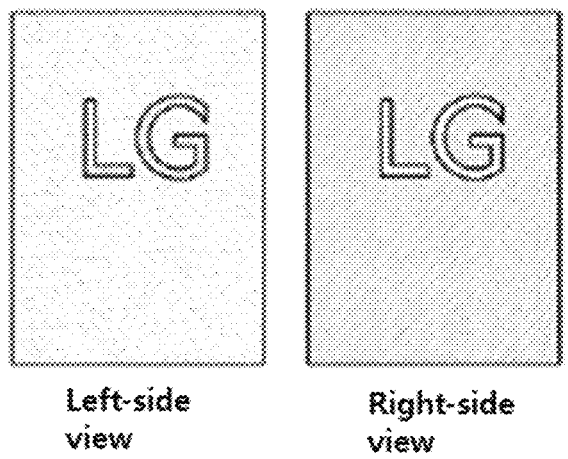
(b)

[FIG. 17]
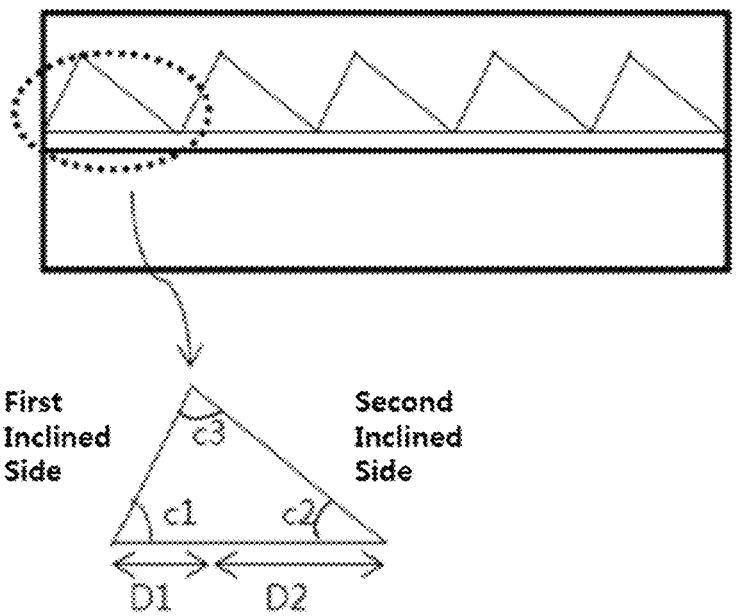
[FIG. 18]
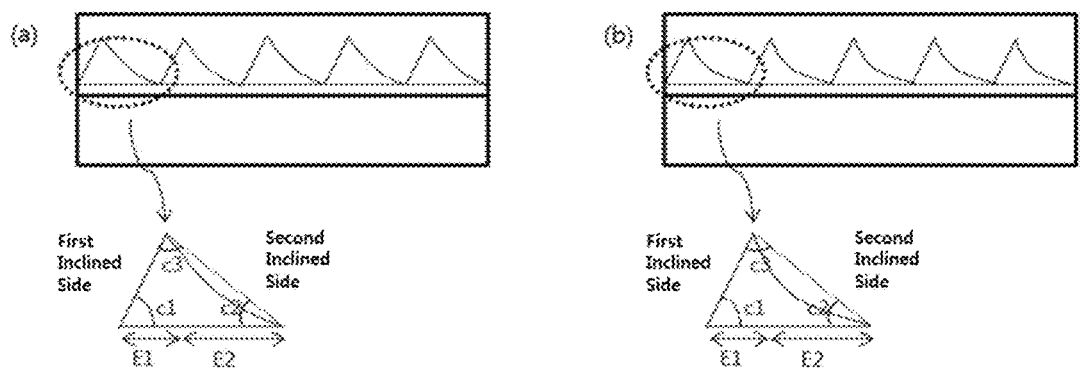

[FIG. 19]
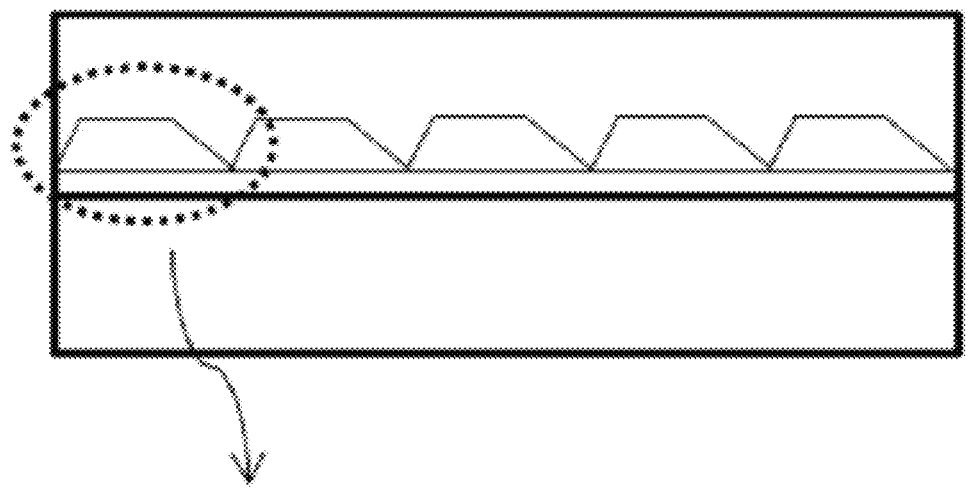
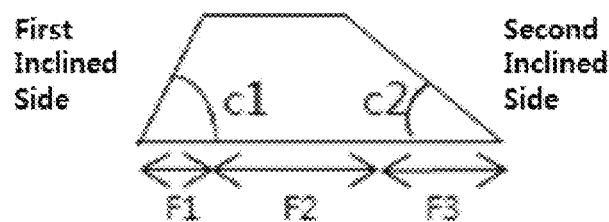
[FIG. 20]
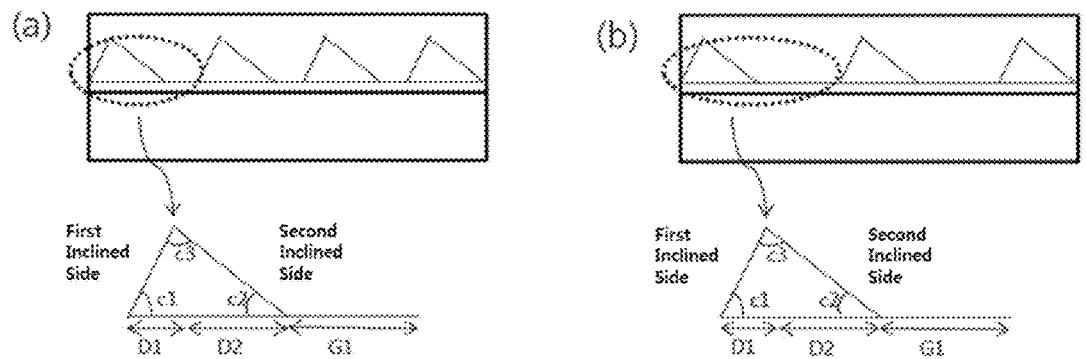

[FIG. 21]
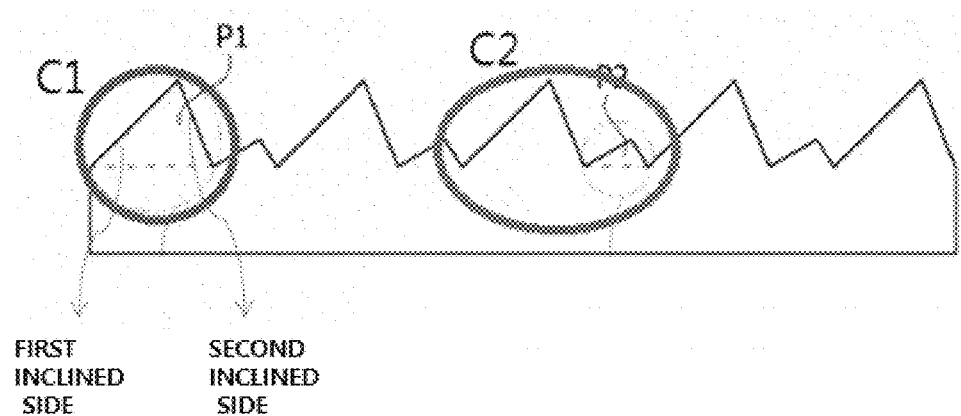
FIRST INCLINED SIDE
SECOND INCLINED SIDE
[FIG. 22]
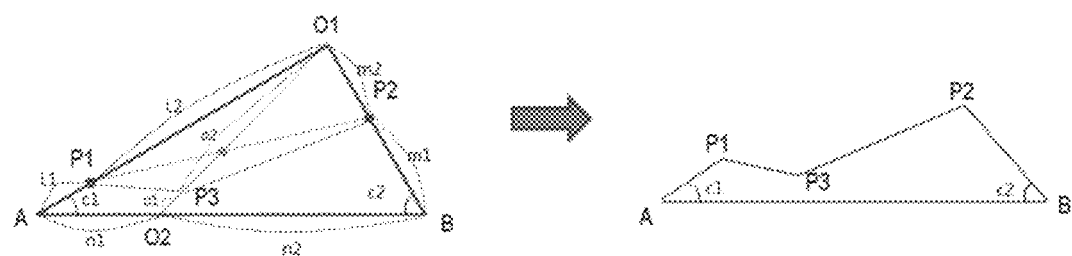
[FIG. 23]
[FIG. 24]
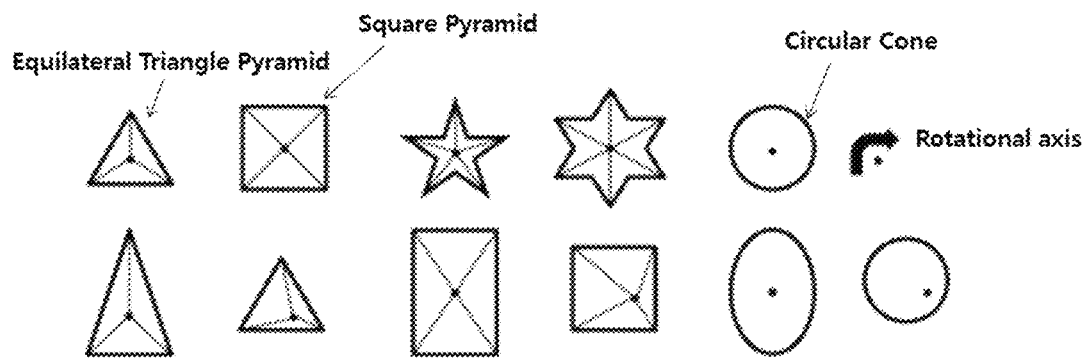

[FIG. 25]
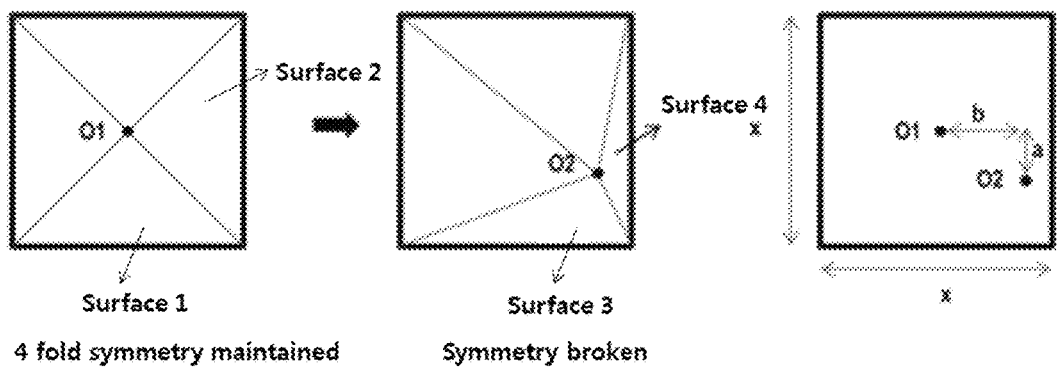
[FIG. 26]
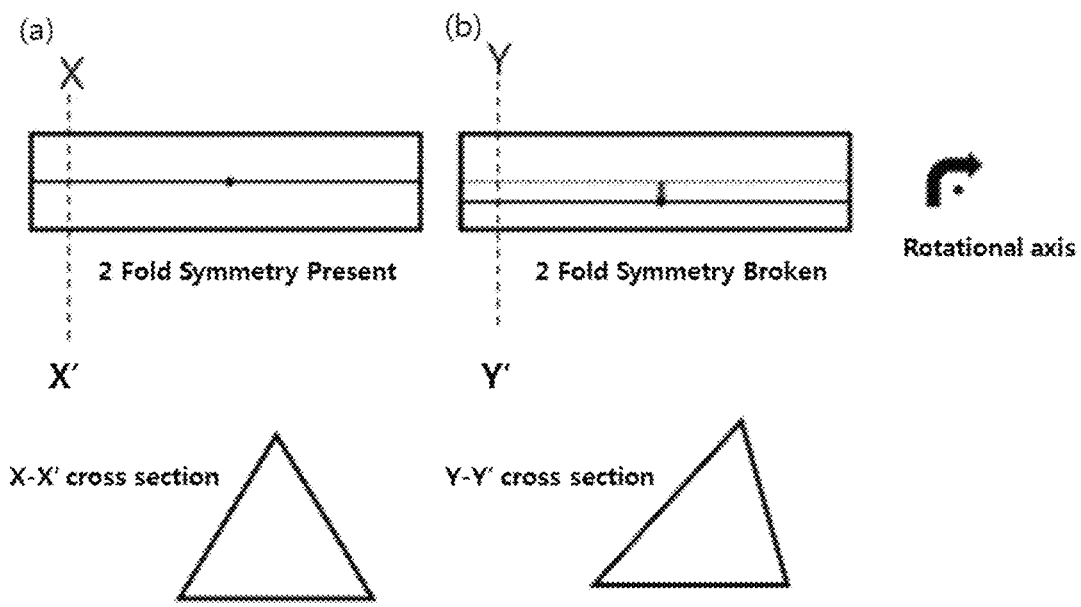

[FIG. 27]
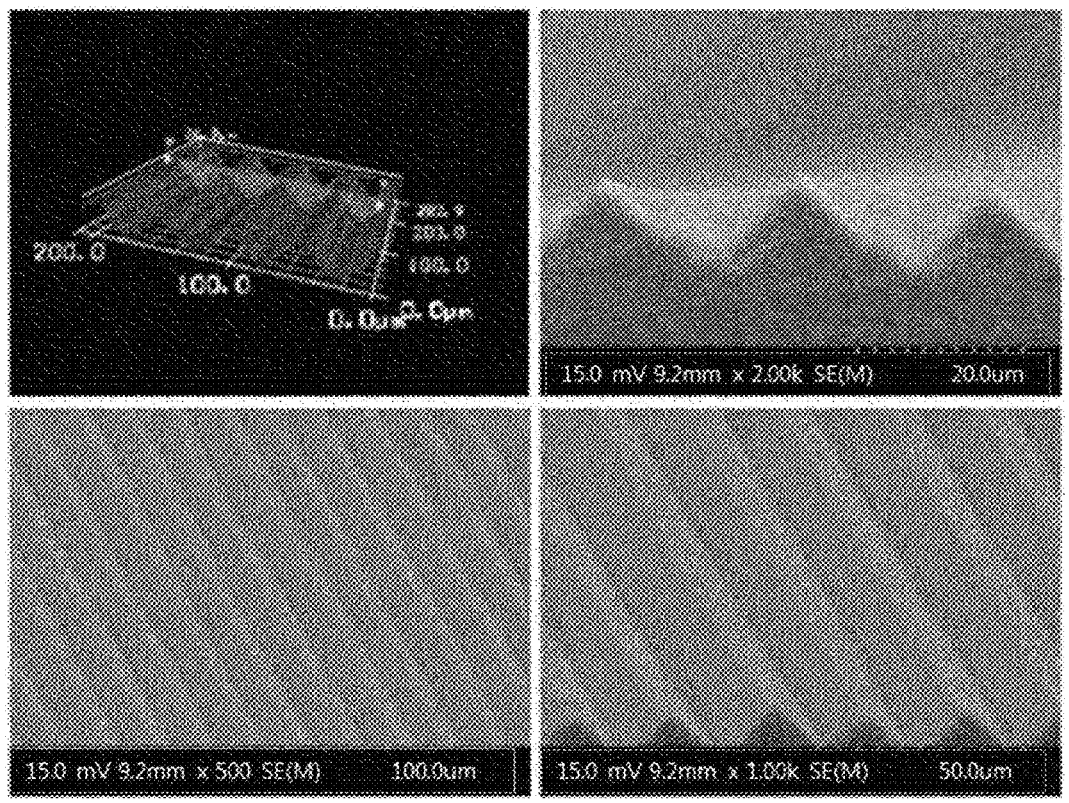
[FIG. 28]
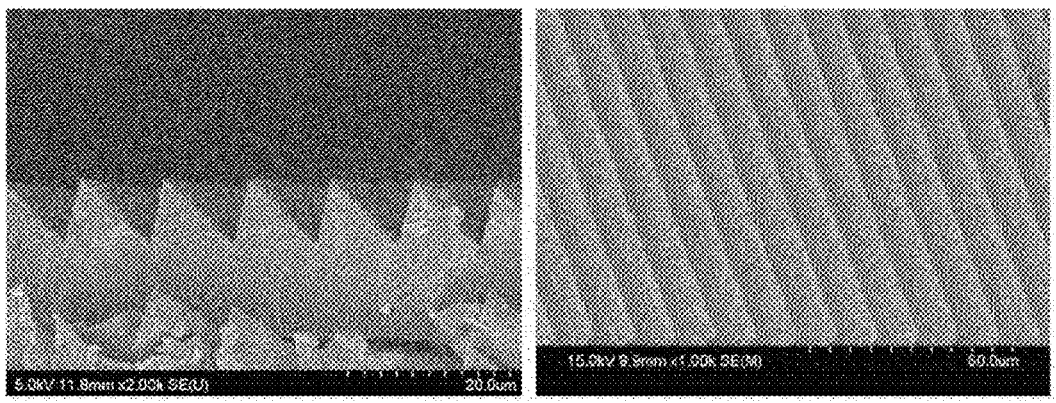

[FIG. 29]
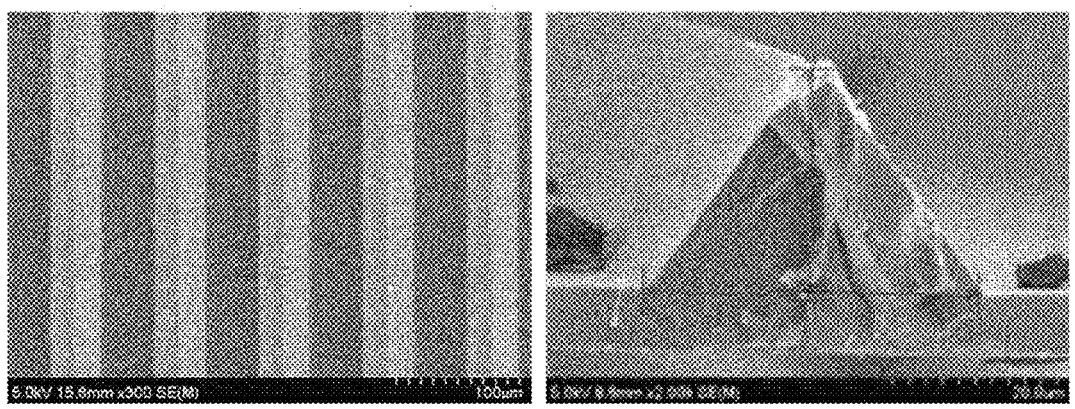
[FIG. 30]
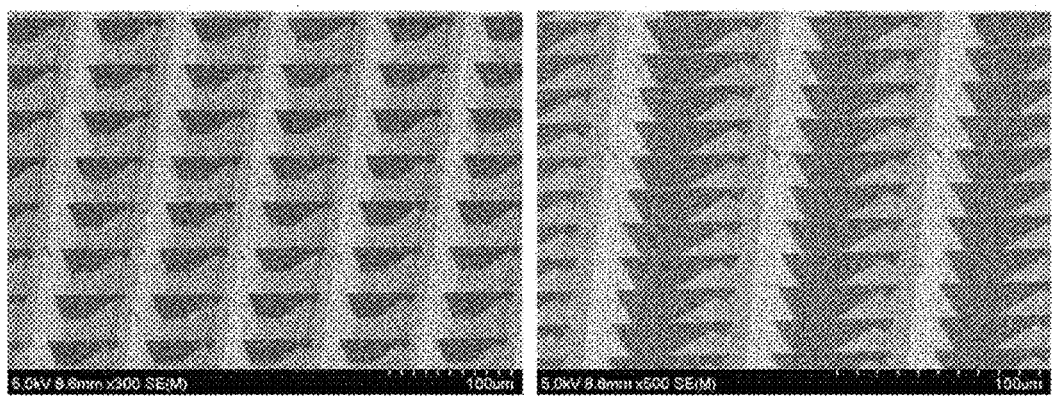

[FIG. 31]
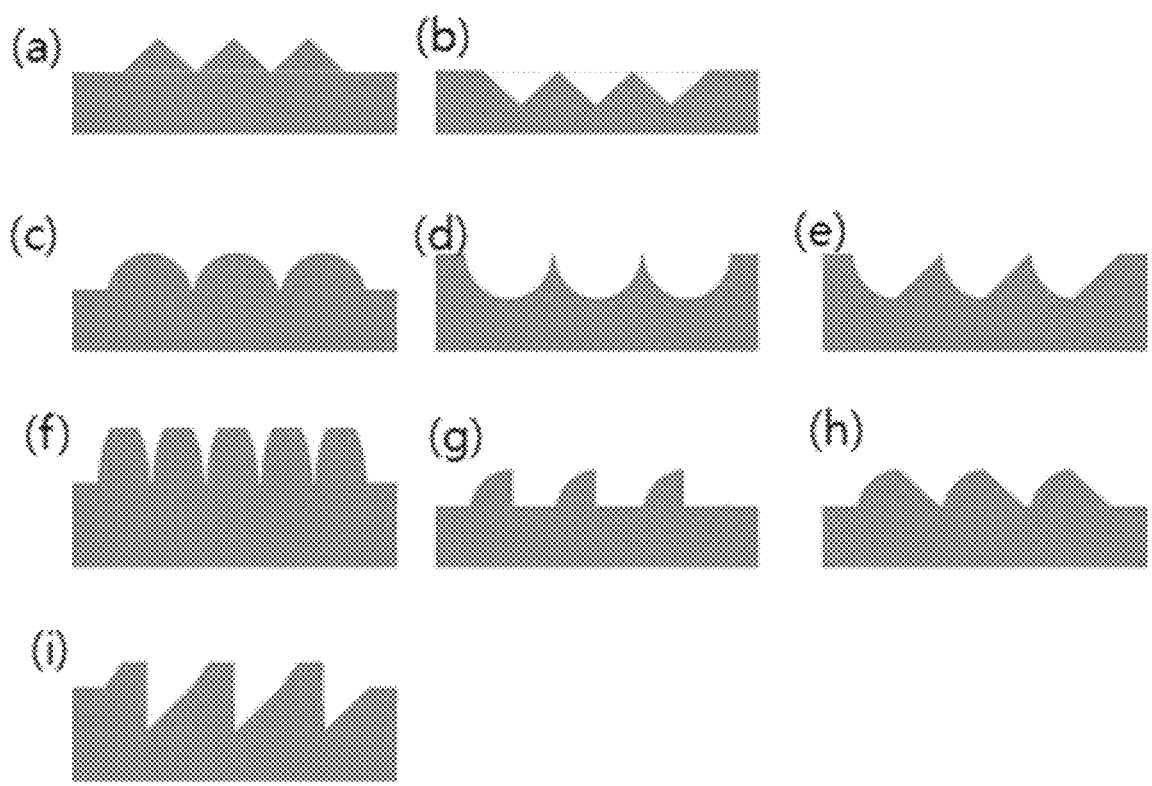

[FIG. 32]
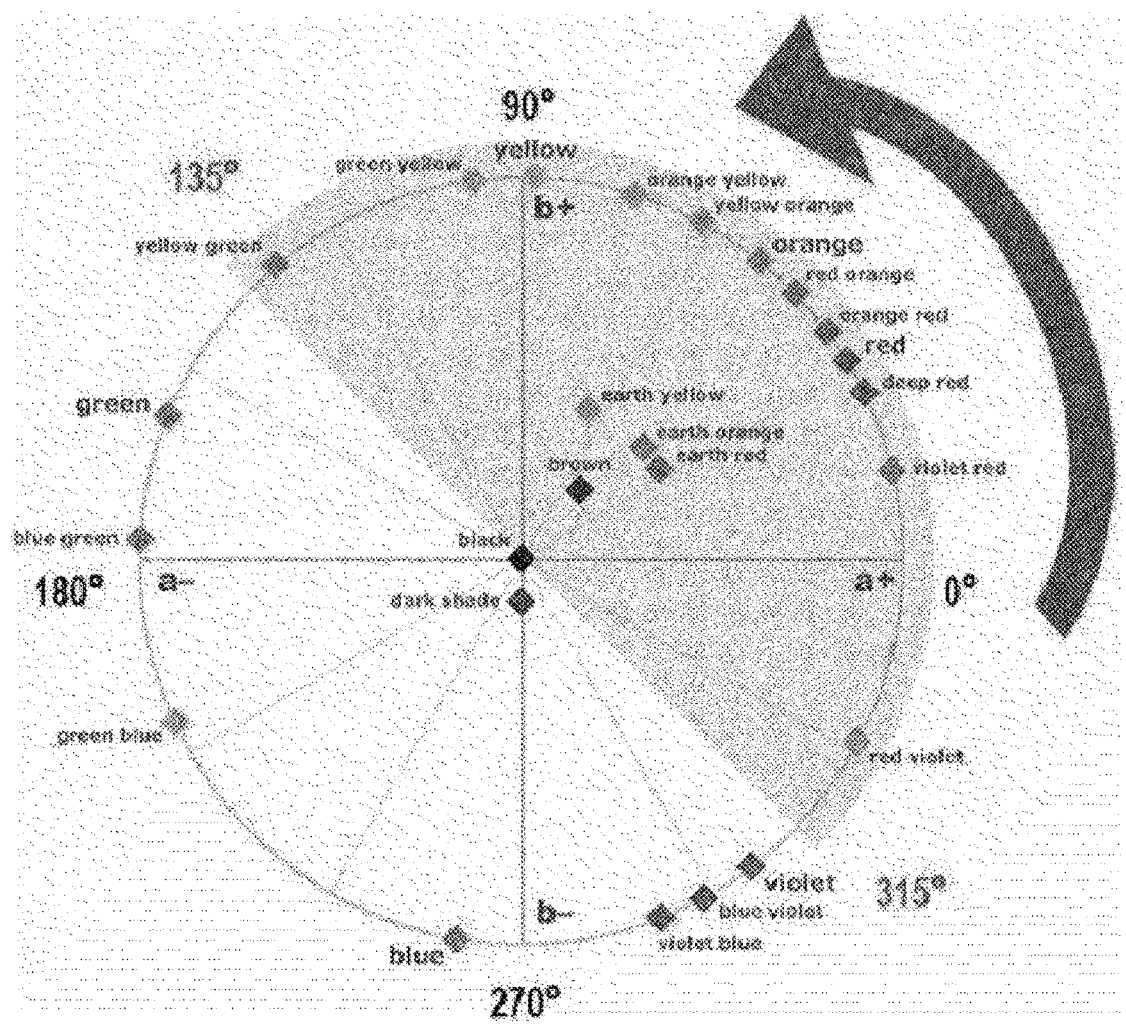

[FIG. 33]
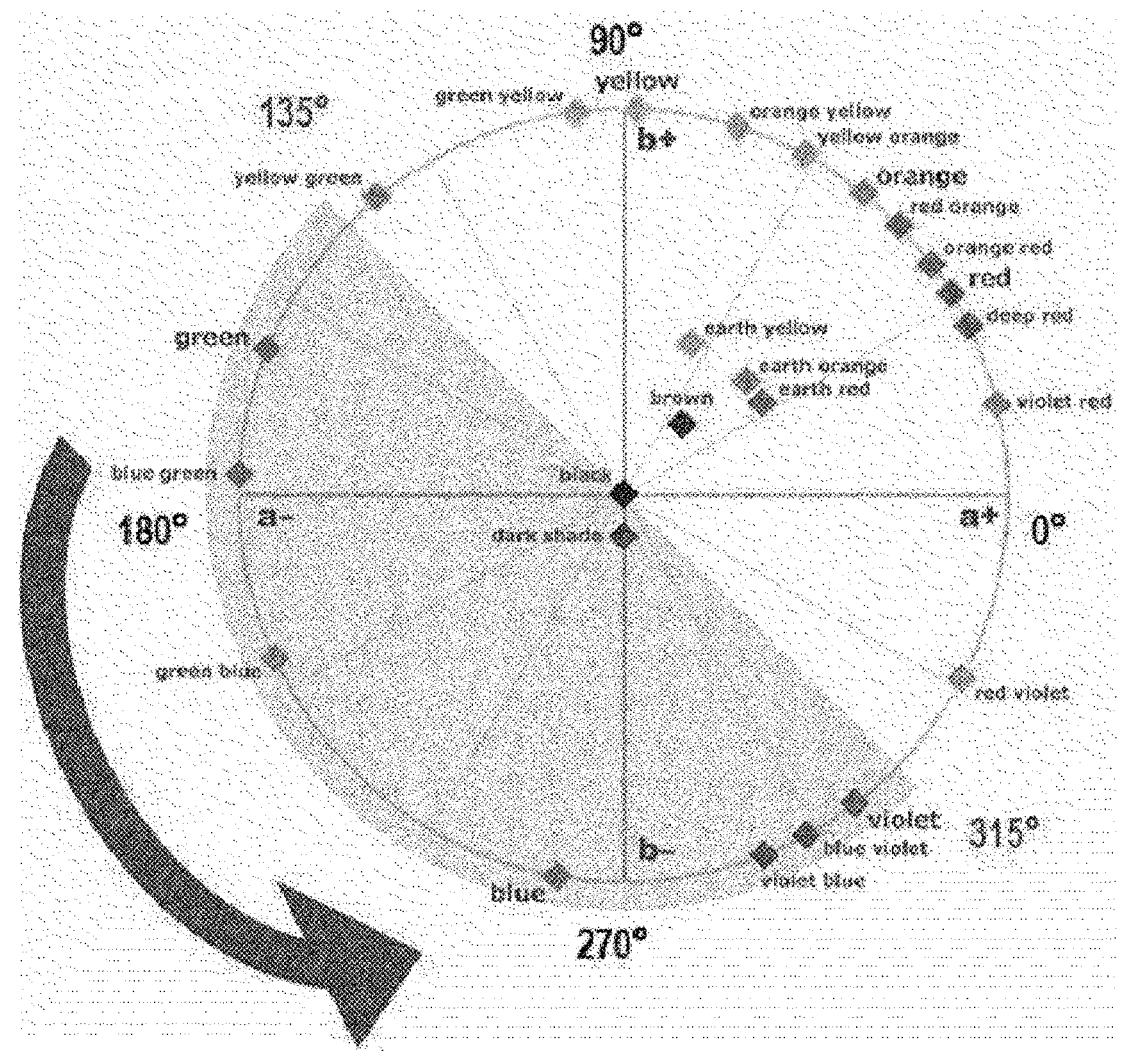

[FIG. 34]
| Classification | Color | H* VALUE |
|---|---|---|
| EXAMPLE 1 | | 71.00 |
| EXAMPLE 2 | | 54.00 |
| EXAMPLE 3 | | 2.00 |
| COMPARATIVE EXAMPLE 1 | | 270.00 |
| COMPARATIVE EXAMPLE 2 | | 299.00 |
| COMPARATIVE EXAMPLE 3 | | 264.00 |
| EXAMPLE 4 | | 74.00 |
| EXAMPLE 5 | | 50.00 |
| EXAMPLE 6 | | 27.00 |
| COMPARATIVE EXAMPLE 4 | | 240.00 |
| COMPARATIVE EXAMPLE 5 | | 283.00 |
| COMPARATIVE EXAMPLE 6 | | 246.00 |
| EXAMPLE 7 | | 74.00 |
| EXAMPLE 8 | | 54.00 |
| EXAMPLE 9 | | 34.00 |
| COMPARATIVE EXAMPLE 7 | | 243.00 |
| COMPARATIVE EXAMPLE 8 | | 303.00 |
| COMPARATIVE EXAMPLE 9 | | 250.00 |
[FIG. 35]
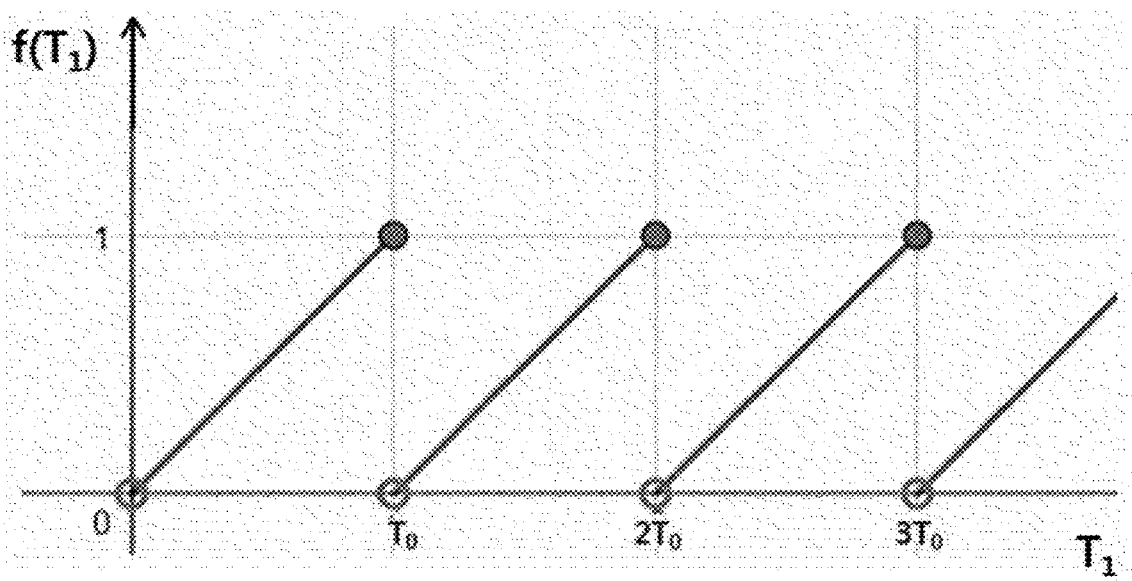

DECORATION MEMBER

This application is a National Phase entry pursuant to 35 U.S.C. § 371 of International Application No. PCT/KR2019/007240 filed on Jun. 14, 2019, and claims priority to and the benefit of Korean Patent Application No. 10-2018-0069234 filed in the Korean Intellectual Property Office on Jun. 15, 2018 and Korean Patent Application No. 10-2018-0132090 filed in the Korean Intellectual Property Office on Oct. 31, 2018, the entire contents of which are incorporated herein by reference.

TECHNICAL FIELD

This application relates to a decoration member.

BACKGROUND ART

In cosmetic containers, various mobile devices, and home appliances, a design of a product, for example, a color, a shape, and a pattern play a big role in adding a value of the product to customers in addition to a function of the product. Product preference and price also depend on the design.

As an example, in the case of a cosmetic compact case, various colors and color senses are implemented in various methods and applied to the product. There are a method for giving the color to a case material itself and a method for attaching a decoration film that implements the color and the shape to the case material to give the design.

Expression of the color in the existing decoration film is implemented through a method comprising printing, deposition, and the like. When expressing heterogeneous colors on a single surface, the color should be printed two or more times, and when it is desired to apply a variety of colors to a three-dimensional pattern, it is practically difficult to implement the expression of the colors. Further, in the existing decoration film, the color is fixed according to a viewing angle and even though there is a slight change, the change is limited to a difference degree of the color sense.

PRIOR ART DOCUMENT

Patent Document

Patent Document 1: Korean Patent Unexamined Publication No. 10-2010-0135837

DETAILED DESCRIPTION OF THE INVENTION

Technical Problem

This application has been made in an effort to provide a decoration member.

Technical Solution

This application provides a decoration member which comprises: a color expression layer comprising a light reflection layer and a light absorption layer provided on the light reflection layer; and a substrate provided on one surface of the color expression layer, in which the light absorption layer comprises a copper nickel oxide ($Cu_aNi_bO_x$) and when a component analysis is performed at any one point of the light absorption layer, ω expressed by Equation 1 below is 0.001 or more and 0.7 or less.

$$\omega = (T_x) \times (\sigma_x) \quad \text{[Equation 1]}$$

$$f(T_1) = \frac{T_1}{T_0} (0 < T_1 \leq T_0) \quad \text{[Equation 2]}$$

$$f(T_1) = f(T_1 + n \times T_0)$$

$$\sigma_x = \frac{a+b}{x} \times 1.2 \quad \text{[Equation 3]}$$

In Equation 1, $T_x$ represents a function value depending on $T_1$ of a function represented by the $f(T_1)$, n represents a positive integer of 1 or more, and $\sigma_x$ is represented by Equation 3 above, in Equation 2 above, $T_1$ represents a thickness of the light absorption layer comprising any one point of the light absorption layer in which the component analysis is performed and $T_0$ is 60 nm, and in Equation 3 above, the a means an element content ratio of copper (Cu), the b means the element content ratio of nickel (Ni), and the x means the element content ratio of oxygen (O).

Advantageous Effects

According to an embodiment of the present invention, a decoration member comprises a light absorbing layer in which a content of each element is adjusted at a specific ratio in addition to a copper nickel oxide, thereby expressing a color of a warm tone.

This application provides a decoration member which has dichroism showing a different color according to a viewing direction and has improved visibility of the dichroism.

BRIEF DESCRIPTION OF DRAWINGS

FIG. 1 illustrates a decoration member according to an embodiment of the present specification.

FIG. 2 illustrates a method for distinguishing a light absorption layer and a light reflection layer.

FIG. 3 illustrates one point of the light absorption layer and a thickness of the light absorption layer comprising the same.

FIG. 4 illustrates a principle of interference of light in the light absorption layer and the light reflection layer.

FIGS. 5 to 13 illustrate a decoration member according to an embodiment of the present specification.

FIGS. 14 to 31 illustrate a shape of a pattern layer.

FIGS. 32 and 33 illustrate a warm tone and a cool tone.

FIG. 34 illustrates a color according to an evaluation example (color evaluation).

FIG. 35 is a graph according to Equation 2.

BEST MODE

Hereinafter, the present specification will be described in detail.

In the present specification, "or" means "and/or" when "or" selectively comprises them listed or comprises all of them listed, unless otherwise defined.

In the present specification, "layer" means covering 70% or more of an area in which the layer exists. Preferably, the "layer" means covering 75% or more and preferably 80% or more.

In the present specification, a "thickness" of a layer means a shortest distance from a lower surface to an upper surface of the layer.

In the present specification, a color represented by a decoration member may be defined by spectral characteristics of a light source, reflectance of an object, and color viewing efficiency of an observer.

For objective color expression, color measurement is required at standard light sources and a standard observer, and a color is expressed in coordinates of a color space. The color of the decoration member may be represented by CIE Lab (L*a*b*) coordinates or LCh coordinates which provide a visually uniform color space. L* represents lightness, +a* represents redness, −a* represents greenness, +b* represents yellowness, −b* represents blueness, and C* and h* will be described later. A total color difference according to a position of the observation in the color space may be expressed as $\Delta E \cdot ab = \sqrt{(\Delta L)^2 + (\Delta a)^2 + (\Delta b)^2}$.

The color measurement may adopt a spectrophotometer (CM-2600d, manufactured by Konica Minolta Co., Ltd.) and reflectance of a sample may be optically analyzed and the reflectance for each wavelength may be represented through a spectrophotometer, and as a result, a spectral reflectance graph and a converted color coordinate may be obtained. In this case, data is obtained at a viewing angle of 8 degrees and the decoration member is measured in horizontal and vertical directions in order to view dichroism of the decoration member.

The viewing angle as an angle formed by a straight line d1 in a normal direction of the surface of a color expression layer of the decoration member and a straight line d2 passing through the spectrophotometer and one point of the decoration member to be measured generally has a range of 0 to 90 degrees.

A case where the viewing angle is 0 degree means measuring in a direction which is the same as the normal direction of the surface of the color expression layer of the decoration member.

In the present specification, a "light absorption layer" and a "light reflection layer" are layers having relative physical properties, the light absorption layer may mean a layer having a higher light absorption than the light reflection layer and the light reflection layer may mean a layer having a higher light reflectivity than the light absorption layer.

Each of the light absorption layer and the light reflection layer may be constituted by a single layer or constituted by two or more layers.

In the present specification, the light absorption layer and the light refection layer are named according to functions thereof. In regard to light having a specific wavelength, a layer that reflects light relatively much may be represented by the light reflection layer and a layer that reflects light relatively little may be represented by the light absorption layer.

FIG. 1 illustrates a lamination structure of a decoration member according to an embodiment of the present specification. In FIG. 1, a decoration member comprising a color expression layer 100 and a substrate 101 is illustrated. The color expression layer 100 comprises a light reflection layer 201 and a light absorption layer 301. Although FIG. 1 illustrates that the substrate 101 is provided on the light absorption layer 301 of the color expression layer 100, the substrate 101 may be provided on the light reflection layer 201.

Through FIG. 2, the light absorption layer and the light reflection layer will be described. In the decoration member of FIG. 2, each layer is laminated in the order of an $L_{i-1}$ layer, an $L_i$ layer, and an $L_{i+1}$ layer based on a light input direction, and an interface $I_i$ is positioned between the $L_{i-1}$ layer and the $L_i$ layer and an interface $I_{i+1}$ is located between the layer $L_i$ and the $L_{i+1}$ layer.

When irradiating light having a specific wavelength in a direction perpendicular to each layer so that thin film interference does not occur, the reflectance at the interface $I_i$ may be expressed by Equation 1 below.

$$\frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \quad \text{[Equation 1]}$$

In Equation 1, $n_i(\lambda)$ denotes a refractive index according to a wavelength $\lambda$ of an i-th layer and $k_i(\lambda)$ denotes an extinction coefficient according to the wavelength $\lambda$ of the i-th layer. The extinction coefficient is a measure that may define how strongly a target material absorbs light at a specific wavelength, and the definition is described below.

By applying Equation 1 above, when a sum of the reflectances for each wavelength at the interface $I_i$ calculated at each wavelength is represented by $R_i$, the $R_i$ is represented by Equation 2 below.

$$R_i = \frac{\sum_{\lambda=380\,nm}^{\lambda=780\,nm} \frac{[n_i(\lambda) - n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\,nm}^{\lambda=780\,nm} \Delta\lambda} \quad \text{[Equation 2]}$$

Hereinafter, the decoration member comprising the light reflection layer and the light absorption layer described above will be described.

The present specification provides a decoration member which comprises: a color expression layer comprising a light reflection layer and a light absorption layer provided on the light reflection layer; and a substrate provided on one surface of the color expression layer, in which the light absorption layer comprises a copper nickel oxide ($Cu_aNi_bO_x$) and when a component analysis is performed at any one point of the light absorption layer, ω expressed by Equation 1 below is 0.001 or more and 0.7 or less.

$$\omega = (T_x) \times (\sigma_x) \quad \text{[Equation 1]}$$

$$f(T_1) = \frac{T_1}{T_0} (0 < T_1 \leq T_0) \quad \text{[Equation 2]}$$

$$f(T_1) = f(T_1 + n \times T_0)$$

$$\sigma_x = \frac{a+b}{x} \times 1.2 \quad \text{[Equation 3]}$$

In Equation 1, $T_x$ represents a function value depending on $T_1$ of a function represented by the $f(T_1)$, n represents a positive integer of 1 or more, and $\sigma_x$ is represented by Equation 3 above, in Equation 2 above, $T_1$ represents a thickness of the light absorption layer comprising any one point of the light absorption layer in which the component analysis is performed and $T_0$ is 60 nm, and in Equation 3 above, the a means an element content ratio of copper (Cu), the b means the element content ratio of nickel (Ni), and the x means the element content ratio of oxygen (O). For example, when the contents of copper (Cu), nickel (Ni) and oxygen (O) at one point are 57.5%, 9.8%, and 39.7%, respectively, a, b, and c may be expressed as 0.575, 0.098, and 0.397, respectively.

In the present specification, a content ratio of a specific element may mean an atomic percentage (at %) of a specific element at any one point of the light absorption layer in which the component analysis is performed.

In the decoration member according to an embodiment of the present specification, a light absorbing layer comprises copper nickel oxide ($Cu_aNi_bO_c$), by controlling the content ratio of each element of copper nickel oxide and adjusting the thickness of the light absorption layer to a specific range, the warm tone may be observed through the light absorption layer. In this case, a relational expression between the content ratio of each element of the copper nickel oxide and the thickness of the light absorption layer may be represented by a warm tone parameter ω represented by Equation 1 above. The warm tone parameter may be represented by $\omega_w$. A subscript w of the $\omega_w$ means the warm tone.

In an embodiment of the present specification, ω represented by Equation 1 above with respect to any one point x of the light absorption layer may be 0.1 or more and 0.7 or less, 0.15 or more and 0.68 or less, or 0.185 or more and 0.65 or less. When satisfying the numerical range, the warm tone may be observed through the light absorption layer and a color desired by a user may be easily indicated among the warm tones.

In the present specification, the 'any one point of the light absorption layer' may mean any one point on the surface or inside the light absorption layer.

In an embodiment of the present specification, the $T_x$ represents a thickness parameter expressed by Equation 2 above. In the light absorption layer, the warm tone or the cool tone are alternately shown as the thickness is changed and the thickness has a predetermined period $T_0$ and the color is changed. In this case, the Tx may mean a ratio of a light absorption layer thickness $T_1$ at any one point to the predetermined period $T_0$ of the thickness of the light absorption layer. For example, when the predetermined period of the thickness is 60 nm, values of the Tx when the thickness of the light absorption layer is 30 nm, 90 nm, and 150 nm are the same as 0.5.

In Equation 2 above, $T_1$ represents the thickness of the light absorption layer comprising any one point of the light absorption layer. $T_1$ means the thickness of the light absorption layer comprising one point when one point of the light absorption layer is selected. When a cross section of the decoration member is observed through a scanning electron microscope (SEM) or the like, the interface between the light reflection layer and the light absorption layer may be confirmed, and it may be confirmed that the layer containing the copper nickel oxide is a light absorption layer through the component analysis. In this case, any one point of the light absorption layer may be selected, and the thickness of the light absorption layer comprising any one point may be calculated and applied as $T_1$.

Equation 2 above shows a periodic function $f(T_1)$ according to the thickness $T_1$ of the light absorption layer. The same $f(T_1)$ value is shown according to the period $T_0$. This is illustrated in FIG. 35. According to FIG. 35, $f(T_1)$ appearing in the range of ($0<T_1 \leq T_0$) appears repeatedly with a constant period $T_0$. For example, $f(0.5T_0)$ in the case of $T_1=0.5T_0$ and $f(1.5T_0)$ in the case of $T_1=0.5T_0+T_0$ have the same value as 0.5.

In an embodiment of the present specification, the a, b, and x may be the same as each other or different from each other and each of the a, b, and x may have a value of more than 0 and less than 1.

According to an embodiment of the present specification, a+b+x=1 may be established.

The thickness $T_1$ may mean a length in a thickness direction of the light absorption layer in a cross section in a direction perpendicular to a surface direction of the light absorption layer while comprising any one point of the light absorption layer.

In FIG. 3, a method for determining one point and the thickness of the light absorption layer is illustrated. When any one point (a red point of FIG. 3) of the light absorption layer is selected, a content ratio parameter expressed by Equation 3 is calculated through the component analysis of this point and a width of a line segment which is perpendicular to the surface direction of the light absorption layer among the line segments passing through this point is calculated to calculate the thickness $T_1$.

Further, the $T_1$ may be achieved by adjusting process pressure used for deposition at the time of forming the light absorption layer, a flow rate of reactive gas to plasma gas, voltage, a deposition time, or a temperature.

In the decoration member of the present invention, the cool tone or the warm tone repeatedly appears with a constant period according to a thickness change of the light absorption layer. In this case, $T_0$ may be expressed as a "period of the thickness of the light absorption layer in which the warm tone repeatedly appears".

The component analysis of the light absorption layer may adopt transmission X-ray component analysis.

In Equation 3 above, the a means an element content ratio of copper (Cu), the b means the element content ratio of nickel (Ni), and the x means the element content ratio of oxygen (O). The element content ratio of each element of the light absorption layer may be measured by a method which is generally used in a field to which the technology belongs and measured by using X-ray photoelectron spectroscopy (XPS) or Electron Spectroscopy for Chemical Analysis (ESCA, Thermo Fisher Scientific Inc.).

According to an embodiment of the present specification, the thickness parameter Tx may be in the range of 0.01 to 0.5, preferably in the range of 0.1 to 0.5, and more preferably in the range of 0.125 to 0.5. When the numerical range is satisfied, the warm tone may be more clearly observed in the decoration member.

In an embodiment of the present specification, the content ratio parameter $\sigma_x$ may be in the range of 0.1 to 5, 0.1 to 3, 0.1 to 1.5, and 1 to 1.5, and more preferably, 1.1 to 1.3. When the numerical range is satisfied, the warm tone may be more clearly observed in the decoration member. The ratio between the elements may be achieved by controlling a gas fraction during deposition of the copper nickel oxide.

Specifically, using X-ray photoelectron spectroscopy (XPS) or electron spectroscopy for Chemical Analysis (ESCA, Thermo Fisher Scientific Inc.), the survey scan in the surface and thickness direction of the light absorption layer is performed and a qualitative analysis is performed and then the quantitative analysis is performed by a narrow scan. In this case, the survey scan and the narrow scan are obtained under a condition of Table 1 below to perform the qualitative and qualitative analyses. Peak background adopts a smart scheme.

TABLE 1

| Element | Scan section binding Energy | Step size |
| --- | --- | --- |
| Narrow(Snapshot) | 20.89 eV | 0.1 eV |
| Survey | −10~1350 eV | 1 eV |

In addition, the component analysis may be performed by preparing a light absorbing layer fragment having the same composition as the light absorption layer, before the decoration member is laminated. Alternatively, when a structure of the decoration member is the substrate/the pattern layer/ the light reflection layer/the light absorption layer, an outermost edge of the decoration member may be analyzed by the aforementioned method. Further, the light absorption layer may be visually confirmed by observing a cross-sectional photograph of the decoration member. For example, when the structure of the decoration member is the substrate/the pattern layer/the light reflection layer/the light absorption layer, it may be confirmed that the interface exists between respective layers in the cross-sectional photograph of the decoration member and the outermost edge layer corresponds to the light absorption layer.

In an embodiment of the present specification, a Hue-angle h* in a CIE LCh color space of the light absorption layer may be in the range of 315 to 360°, in the range of 0 to 150°, in the range of 320 to 360° and in the range of 0 to 105°, and in the range of 320 to 360° and 0 to 100°.

When the Hue-angle h* is in the range, the warm tone may be observed from the decoration member. The warm tone means that the numerical range is satisfied in the CIE LCh color space. The color corresponding to the warm tone is illustrated in FIG. 32 and the color corresponding to the cool tone is illustrated in FIG. 33.

In an embodiment of the present specification, L in the CIE LCh color space of the light absorption layer may be in the range of o to 100 or 30 to 100.

In an embodiment of the present specification, C in the CIE LCh color space of the light absorption layer may be in the range of 0 to 100, 1 to 80, or 1 to 60.

In the present specification, the CIE LCh color space is a CIE Lab color space and here, instead of a* and b* of Cartesian Coordinates, cylinder coordinates C* (chroma, relative color saturation), L* (distance from L axis), and h* (Hue-angle, Hue-angle in CIE Lab hue circle) are used.

In an embodiment of the present specification, a refractive index n of the light absorption layer at a wavelength of 400 nm may be preferably in the range of 0 to 8, and in the range of 0 to 7, in the range of 0.01 to 3, and in the range of 2 to 2.5. The refractive index n may be calculated as sin θa/sin θb (θa represents an angle of light incident on the surface of the light absorption layer and θb represents an angle of refraction of light inside the light absorption layer).

In an embodiment of the present specification, the refractive index n of the light absorption layer at a wavelength range of 380 to 780 nm may be preferably in the range of 0 to 8, and in the range of 0 to 7, in the range of 0.01 to 3, and in the range of 2 to 2.5.

In an embodiment of the present specification, the extinction coefficient k of the light absorption layer at the wavelength of 400 nm may be preferably in the range of more than 0 and 4 or less and in the range of 0.01 to 4 and in the range of 0.01 to 3.5, in the range of 0.01 to 3, and in the range of 0.1 to 1. The extinction coefficient k represents $-\lambda/4\pi I$ (dI/dx) (where the extinction coefficient represents a path unit length dx in the light absorption layer, for example, a value acquired by multiplying a reduction fraction dI/I of light intensity per meter by $\lambda/4\pi$, where $\lambda$ represents the wavelength of light).

In an embodiment of the present specification, the extinction coefficient k of the light absorption layer in the wavelength range of 380 to 780 nm may be preferably in the range of more than 0 and 4 or less and in the range of 0.01 to 4 and in the range of 0.01 to 3.5, in the range of 0.01 to 3, and in the range of 0.1 to 1. Since the extinction coefficient k is in the range in an entire visible light wavelength range of 400 nm or 380 nm to 780 nm, the entire visible light wavelength range of 400 nm or 380 nm to 780 nm may serve as the light absorption layer within a visible light range.

As described above, a principle of expressing the color of the light absorption layer having a specific extinction coefficient and refractive index and a principle of color expression of the decoration member expressing the color by adding a dye to a conventional substrate are different. For example, a case of using a scheme of absorbing light by adding a dye to a resin and a case of using a material having the extinction coefficient as described above are different from each other in terms of a spectrum of absorbing light. When the dye is added to the resin to absorb light, an absorption wavelength band is fixed, and only a phenomenon in which the amount of absorption changes with a change in coating thickness occurs. In addition, in order to obtain a desired light absorption amount, a thickness change of at least several micrometers or more is required to adjust the light absorption amount. On the other hand, in a material having the extinction coefficient, even if the thickness varies on a scale of several or tens of nanometers, a wavelength band of absorbed light changes.

In addition, when the dye is added to the conventional resin, only a specific color by the dye is expressed, and thus various colors may not be exhibited. On the other hand, the light absorption layer of the present invention has an advantage in that by using a specific material rather than the resin, the color may be variously exhibited by an interference phenomenon of light without the addition of the dye.

According to the embodiments, the light is absorbed on an incident path and a reflection path of the light in the light absorption layer and further, the light is reflected on each of the surface of the light absorption layer and the interface between the light absorption layer 301 and the light reflection layer 201 and two reflected light constructively supplements and destructively interferes with each other.

In the present specification, the light reflected from the surface of the light absorption layer may be represented by surface reflected light and the light reflected from the interface between the light absorption layer and the light reflection layer may be represented by interface reflected light. FIG. 4 is a schematic diagram of such an operation principle. In FIG. 4, a structure in which the substrate 101 is provided on the light reflection layer 201 is illustrated, but the present specification is not limited thereto and the position of the substrate 101 may be disposed at a different position therefrom.

In an embodiment of the present specification, the light absorption layer may be constituted by a single layer or two layers or more of multiple layers.

In an embodiment of the present specification, the light absorption layer may further comprise one or two or more selected from a group consisting of metal, metalloid, and oxide, nitride, oxynitride, and carbide of the metal or the metalloid. The oxide, nitride, oxynitride, or carbide of the metal or the metalloid may be formed by a deposition condition set by those skilled in the art, etc. The light absorption layer may comprise the same metal, metalloid, two or more alloys or oxynitrides as the light reflection layer.

In an embodiment of the present specification, the thickness $T_1$ of the light absorption layer may be determined according to a desired color in a final structure, for example, may be 1 nm or more and 300 nm or less, 1 nm or more and 30 nm or less, 61 nm or more and 90 nm or less, or 121 nm or more and 150 nm or less.

In an embodiment of the present specification, the material of the light reflection layer is not particularly limited as long as the material is a material capable of reflecting light, but the light reflectance may be determined according to the material, and for example, the color is easily implemented at a light reflectance of 50% or more. The light reflectance may be measured using an ellipsometer.

In an embodiment of the present specification, the light reflection layer may be a metal layer, a metal oxide layer, a metal nitride layer, a metal oxynitride layer, or an inorganic layer. The light reflection layer may be constituted by a single layer or constituted by two layers or more of multiple layers.

In an embodiment of the present specification, the light reflection layer is constituted by a single layer or multiple layers comprising one or two types or more of materials selected from the group consisting of indium (In), titanium (Ti), and tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag) and one or two types or more of materials selected from the group consisting of an oxide, a nitride, or an oxynitride thereof and carbon and a carbon composite.

In an embodiment of the present specification, the light reflection layer may comprise two or more alloys selected from the above materials, oxides, nitrides or oxynitrides thereof.

In an embodiment of the present specification, the light reflection layer is manufactured by using an ink comprising carbon or a carbon composite to implement a high resistance reflection layer. The carbon or carbon composite comprises carbon black, CNT, and the like.

In an embodiment of the present specification, the ink comprising the carbon or carbon composite material may comprise the above-described material or an oxide, a nitride, or an oxynitride thereof and comprise, for example, one or two types or more of oxides selected from the group consisting of indium (In), titanium (Ti), and tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag). A curing process may be additionally performed after printing the ink comprising the carbon or carbon composite.

In an embodiment of the present specification, when the light reflection layer comprises two or more kinds of materials, two or more kinds of materials may be formed by one process, for example, a deposition or printing method, but a method for first forming the layer with one or more kinds of materials and then additionally forming the layer thereon with one or more kinds of materials may be used. For example, the layer is formed by depositing indium or tin and then the ink comprising the carbon is printed and then cured, thereby forming the light reflection layer. The ink may additionally comprise oxide such as titanium oxide or silicon oxide.

In an embodiment of the present specification, the thickness of the light reflection layer may be determined according to a desired color in a final structure, and for example, may be 1 nm or more and 100 nm or less, 10 nm or more and 90 nm or less, or 30 nm or more and 90 nm or less.

Light Absorption Layer Structure

In an embodiment of the present specification, the light absorption layer may exhibit various shapes by adjusting a deposition condition and the like when forming the light absorption layer.

In an embodiment of the present specification, the light absorption layer comprises two or more points having different thicknesses.

In an embodiment of the present specification, the light absorption layer comprises two or more regions having different thicknesses.

In an embodiment of the present specification, the light absorption layer may comprise an inclined surface.

The example of the structure according to the embodiment is illustrated in FIGS. 5 and 6. FIGS. 5 and 6 illustrate a structure in which the light reflection layer 201 and the light absorption layer 301 are laminated (not illustrated). According to FIGS. 5 and 6, the light absorption layer 301 has two or more points having different thicknesses. According to FIG. 5, the thicknesses of the light absorption layer 301 at points A and B are different from each other. According to FIG. 6, the thicknesses of the light absorption layer 301 at region C and region D are different from each other.

In an embodiment of the present specification, the light absorption layer comprises at least one region in which a top surface has an inclined surface having an inclination angle greater than 0 degree and 90 degrees or smaller and the light absorption layer comprises at least one region having a thickness different from a thickness in a region having any one inclined surface. The inclined surface may define an angle formed by any one straight line included in the top surface of the light absorption layer and a straight line parallel to the light reflection layer as the inclined surface. For example, the inclined angle of the top surface of the light absorption layer of FIG. 5 may be approximately 20 degrees.

A surface characteristic such as the inclined surface of the top surface of the light reflection layer may be the same as that of the light absorption layer. For example, by using the deposition method at the time of forming the light absorption layer, the top surface of the light absorption layer may have the same gradient as the top surface of the light reflection layer. However, the gradient of the top surface of the light absorption layer of FIG. 5 is different from the gradient of the top surface of the light reflection layer.

The structure of the decoration member having the light absorption layer in which the top surface has the inclined surface is illustrated in FIG. 7. In a structure in which the substrate 101, the light reflection layer 201, and the light absorption layer 301 are laminated, a thickness t1 in region E of the light absorption layer 301 and a thickness t2 in region F are different from each other. Reference numeral 401 may be a color film.

FIG. 7 relates to a light absorption layer having a structure in which inclined surfaces facing each other, i.e., cross sections have a triangular shape. As illustrated in FIG. 7, in the structure of a pattern having the inclined surfaces facing each other, the thicknesses of the light absorption layer on two surfaces having a triangular structure may be different from each other even though the deposition is performed under the same condition. As a result, a light absorption layer having two or more regions with different thicknesses may be formed only by one process. Accordingly, an expression color varies depending on the thickness of the light absorption layer. In this case, when the thickness of the light reflection layer is a predetermined value or more, the thickness does not affect the color change.

In FIG. 7, a structure in which the substrate 101 is provided on the light reflection layer 201 is illustrated, but the present specification is not limited to such a structure and the position of the substrate 101 may be disposed at a different position therefrom as described above.

Further, a surface of the substrate 101 of FIG. 7 contacting the light reflection layer 201 is a flat surface, but a surface of the light reflection layer 201 contacting the light reflection layer 201 of the substrate 101 may have a pattern having the same slope as the top surface of the light reflection layer 201. This is illustrated in FIG. 8. In this case, there may be a difference even in thickness of the light absorption layer due to the difference in slope of the pattern of the substrate. However, the present specification is not limited thereto and even though the substrate and the light absorption layer are made to have different slopes by using a different deposition method, dichroism to be described below may be exhibited by differentiating the thicknesses of the light absorption layer at both sides of the pattern.

In an embodiment of the present specification, the light absorption layer comprises one or more regions in which the thickness gradually changes. In FIG. 9, a structure in which the thickness of the light absorption layer 301 gradually changes is illustrated.

In an embodiment of the present specification, the light absorption layer comprises at least one region in which the top surface has an inclined surface having an inclination angle greater than 0 degree and 90 degrees or smaller and at least one region having the inclined surface has a structure in which the thickness of the light absorption layer gradually changes. The structure of the light absorption layer comprising the region in which the top surface has the inclined surface is illustrated in FIG. 9. Both regions G and H of FIG. 9 have a structure in which the top surface of the light absorption layer has the inclined surface and the thickness of the light absorption layer gradually changes.

In the present specification, the structure in which the thickness of the light absorption layer changes means that the cross section in the thickness direction of the light absorption layer comprises a point where the thickness of the light absorption layer is smallest and a point where the thickness of the light absorption layer is largest and the thickness of the light absorption layer increases according to a direction of the point where the thickness of the light absorption layer is smallest to the point where the thickness of the light absorption layer is largest. In this case, the point where the thickness of the light absorption layer is smallest and the point where the thickness of the light absorption layer is largest may mean any point on the interface between the light absorption layer and the light reflection layer.

In an embodiment of the present specification, the light absorption layer may comprise a first region having a first inclined surface in which the inclined angle is in the range of 1 to 90 degrees and may further comprise two or more regions in which the top surface has an inclined surface having a different inclination direction from the first inclined surface or a different inclined angle from the first inclined surface or the top surface is horizontal. In this case, the thicknesses of the light absorption layer in the first region and the two or more regions may be all different from each other.

Substrate

In an embodiment of the present specification, the decoration member comprises a substrate provided on one surface of the color expression layer.

In an embodiment of the present specification, the decoration member comprises a substrate 101 provided on at least one of a surface of the light reflection layer 201 facing the light absorption layer 301; or a surface of the light absorption layer facing the light reflection layer. For example, the substrate may be provided on an opposite surface to a surface of the light reflection layer facing the light absorption layer (FIG. 10(a)); or an opposite surface to a surface of the light absorption layer facing the light reflection layer (FIG. 10(b)).

In an embodiment of the present specification, the substrate may comprise a plastic injection molding or a glass substrate for a cosmetic case. More specifically, the plastic injection molding may comprise at least one of polypropylene (PP), polystyrene (PS), polyvinylacetate (PVAc), polyacrylate, polyethylene terephthalate (PET), polyvinyl chloride (PVC), polymethyl methacrylate (PMMA), ethylenevinyl acetate copolymer (EVA), polycarbonate (PC), polyamide, and styrene-acrylonitrile copolymer (SAN), but is not limited thereto.

Further, the plastic injection molding may be a flat-type plastic injection molding without a curve (specific pattern) or a plastic injection molding with the curve (specific pattern).

The plastic injection molding may be produced by a plastic molding method. The plastic molding methods comprise compression molding, injection molding, air blow molding, thermoforming, hot melt molding, foam molding, roll molding reinforced plastic molding, and the like. The compression molding is a molding method for putting and heating the material in a mold and then applying pressure and the compression molding as the oldest molding method may be primarily used for molding of a thermosetting resin such as a phenol resin. The injection molding is a molding method in which a plastic melt liquid is pushed into a transporter and filled in the mold through a nozzle, and both a thermoplastic resin and the thermosetting resin may be molded and may be referred to as the most commonly used molding method. A resin currently used as the product case is SAN. The air blow molding is a method of molding a product by inserting a plastic parison in the center of the mold and injecting air, and as a molding method for manufacturing a plastic bottle or a small case is very fast in manufacturing speed of the product.

In an embodiment of the present specification, as the glass substrate, a glass having a transmittance of 80% or more may be used.

In an embodiment of the present specification, the thickness of the substrate may be selected as necessary and may have a range of 50 to 200 μm, for example.

In an embodiment of the present specification, the decoration member may be manufactured by forming the light reflection layer on the substrate and the light absorption layer provided on the light reflection layer. More specifically, in the decoration member, the light absorption layer and the light reflection layer may be sequentially formed on the substrate using a deposition process, and the like, and the light reflection layer and the light absorption layer may be sequentially formed on the substrate using the deposition process or the like, but is not limited thereto.

Color Film

In an embodiment of the present specification, the color expression layer further comprises a color film.

In an embodiment of the present specification, the decoration member further comprises a color film on an opposite surface to a surface of the light absorption layer facing the light reflection layer, between the light absorption layer and the light reflection layer, or on an opposite surface to the surface of the light reflection layer facing the light absorption layer. The color film may serve as the substrate. For example, a dye or a pigment is added to a film used as the substrate to be used as the color film.

In an embodiment of the present specification, if the color film is a film in which a color difference ΔE*ab which is a distance in a space of L*a*b* on the color coordinates CIE L*a*b* of the color expression layer exceeds 1 when the color film exists as compared with a case where the color film is not provided, the color film is not particularly limited.

The color may be represented by CIE L*a*b* and the color difference may be defined using a distance ΔE*ab in the L*a*b* space. Specifically, $\Delta E = \sqrt{\Delta L^{*2} + \Delta a^{*2} + \Delta b^{*2}}$ and an observer may not recognize the color difference within the range of 0<ΔE*ab<1 [Reference Document: Machine Graphics and Vision 20(4):383-411]. Accordingly, in the present specification, the color difference depending on the addition of the color film may be defined as ΔE*ab>1.

FIG. 11 illustrates the color expression layer comprising the color film, FIG. 11(a) illustrates a structure in which the light reflection layer 201, the light absorption layer 301, and the color film 401 are sequentially laminated, FIG. 11(b) illustrates a structure in which the light reflection layer 201, the color film 401, and the light absorption layer 301 are sequentially laminated, and FIG. 11(c) illustrates a structure in which the color film 401, the light reflection layer 201, and the light absorption layer 301 are sequentially laminated.

In an embodiment of the present specification, when the substrate is provided on the opposite surface to the surface of the light reflection layer facing the light absorption layer and the color film is located on the opposite surface to the surface of the light reflection layer facing the light absorption layer, the color film may be provided between the substrate and the light reflection layer or on the opposite surface of the surface of the substrate facing the light reflection layer. As another example, when the substrate is provided on the opposite surface to the surface of the light absorption layer facing the light absorption layer and the color film is located on the opposite surface to the surface of the light absorption layer facing the light reflection layer, the color film may be provided between the substrate and the light absorption layer or on the opposite surface of the surface of the substrate facing the light absorption layer.

In an embodiment of the present specification, the substrate is provided on the opposite surface of the surface of the light reflection layer facing the light absorption layer and the color film is additionally provided. FIG. 12(a) illustrates a structure in which a color film 401 is provided on the opposite surface of the light absorption layer 301 to the reflection layer 201, FIG. 12(b) illustrates a structure in which the color film 401 is provided between the light absorption layer 301 and the light reflection layer 201, FIG. 12(c) illustrates a structure in which the color film 401 is provided between the light reflection layer 201 and the substrate 101, and FIG. 12(d) illustrates a structure in which the color film 401 is provided on the opposite surface of the substrate 101 to the light reflection layer 201. FIG. 12(e) illustrates a structure in which color films 401a, 401b, 401c, and 401d are provided on the opposite surface of the light absorption layer 310 to the light reflection layer 201, between the light absorption layer 301 and the light reflection layer 201, between the light reflection layer 201 and the substrate 101, and on the opposite surface of the substrate 101 to the light reflection layer 201 and the present invention is not limited thereto and one to three may be omitted among the color films 401a, 401b, 401c, and 401d.

In an embodiment of the present specification, the substrate is provided on the opposite surface of the surface of the light absorption layer facing the light reflection layer and the color film is additionally provided. FIG. 13(a) illustrates a structure in which the color film 401 is provided on the opposite surface of the substrate 101 to the light absorption layer 301, FIG. 13(b) illustrates a structure in which the color film 401 is provided between the substrate 101 and the light absorption layer 301, FIG. 13(c) illustrates a structure in which the color film 401 is provided between the light absorption layer 301 and the light reflection layer 201, and FIG. 13(d) illustrates a structure in which the color film 401 is provided on the opposite surface of the light reflection layer 201 to the light absorption layer 301. FIG. 13(e) illustrates a structure in which color films 401a, 401b, 401c, and 401d are provided on the opposite surface of the substrate 101 to the light absorption layer 310, between the substrate 101 and the light absorption layer 301, between the light absorption layer 301 and the light reflection layer 201, and on the opposite surface of the light reflection layer 201 to the light absorption layer 301 and the present invention is not limited thereto and one to three may be omitted among the color films 401a, 401b, 401c, and 401d.

In the structures illustrated in FIGS. 12(b) and 12(c), when visible light transmittance of the color film is greater than 0%, the light reflection layer may reflect light incident through the color film, thereby implementing the color by laminating the light absorption layer and the light reflection layer.

In the structures illustrated in FIGS. 12(c), 12(d), and 13(d), the light transmittance of the color expressed from the color film of the light reflection layer 201 is 1% or more, preferably 3% or more, and more preferably 5% or more so as to recognize a color difference change due to the addition of the color film. The reason is that the transmitted light may be mixed with the color by the color film in the range of the visible light transmittance.

In an embodiment of the present specification, the color film may be provided in a state in which one sheet or two or more homogeneous or heterogeneous sheets are laminated.

The color film may be used in combination with the color expressed from the laminated structure of the light reflection layer and the light absorption layer described above to express a desired color. For example, a color film in which one or two or more of pigments and dyes are dispersed in a matrix resin and exhibit the color may be used. The color film as described above may be formed by coating a color film forming composition directly to a position where the color film may be provided or a method for coating the color film forming composition on a separate substrate, or arranging or attaching the color film at the position where the color film may be provided after preparing the color film by using a known molding method such as casting, extrusion, or the like may be used. The coating method may adopt wet coating or dry coating.

Pigments and dyes that may be included in the color film may be selected from those known in the art to achieve a desired color from the final decoration member, and may adopt one or two or more among red, yellow, purple, blue, pink series pigments and dyes. Specifically, dyes comprising a perinone-based red dye, an anthraquinone-based red dye, a methine-based yellow dye, an anthraquinone-based yellow dye, an anthraquinone-based violet dye, a phthalocyanine-based blue dye, a thioindigo-based pink dye, and an isoxindigo-based pink dye may be used alone or in combination. Pigments comprising carbon black, copper phthalocyanine (C.I. Pigment Blue 15:3), C.I. Pigment Red 112, Pigment blue, and Isoindoline yellow may be used alone or in combination. As the dye or pigment as described above, commercially available dyes or pigments may be used, and materials such as Ciba ORACET Co., Ltd. and Chokwang Paint Co., Ltd. may be used. The types of dyes or pigments and colors of the dyes or pigments are only examples, and various known dyes or pigments may be used, thereby implementing more various colors.

As the matrix resin included in the color film, materials known as materials such as a transparent film, a primer layer, an adhesive layer, and a coating layer may be used, and are not particularly limited thereto. For example, various materials comprising acrylic resins, polyethylene terephthalate resins, urethane resins, linear olefin resins, cycloolefin resins, epoxy resins, triacetyl cellulose resins, and the like may be selected, and copolymers of the above exemplified materials or mixtures may also be used.

When the color film is disposed closer to the position for observing the decoration member than the light reflection layer or the light absorption layer, for example, in the structures illustrated in FIGS. 12(a) and 12(b), FIGS. 13(a), 13(b), and (c), the light transmittance of the color expressed from the light reflection layer, the light absorption layer, or a lamination structure of the light reflection layer and the light absorption layer in the color film is 1% or more, preferably 3% or more, and more preferably 5% or more. Accordingly, the color expressed from the color film and the color expressed from the light reflection layer, the light absorption layer, or the lamination structure thereof are together combined to achieve the desired color.

The thickness of the color film is not particularly limited, and if the desired color may be represented, one of those skilled in the art may select and set the thickness. For example, the thickness of the color film may be 500 nm to 1 mm.

Pattern Layer

In an embodiment of the present specification, the color expression layer or substrate may comprise a pattern layer.

In an embodiment of the present specification, the substrate comprises the pattern layer and the pattern layer is provided adjacent to the color expression layer.

In the present specification, a case where the pattern layer is provided adjacent to the color expression layer may mean that the pattern layer directly contacts the color expression layer. For example, the pattern layer may directly contact the light reflection layer of the color expression layer or the pattern layer may directly contact the light absorption layer of the color expression layer.

In an embodiment of the present specification, the pattern layer comprises a convex or concave shape having a cross section of an asymmetrical structure.

In an embodiment of the present specification, the pattern layer comprises the convex shape having the cross section of the asymmetrical structure.

In an embodiment of the present specification, the pattern layer comprises the concave shape having the cross section of the asymmetrical structure.

In an embodiment of the present specification, the pattern layer comprises a convex shape having a cross section of an asymmetric structure and a concave shape having the cross section of the asymmetric structure.

In the present specification, the "cross section" means the surface at the time of cutting the convex or concave in any one direction. For example, when the decoration member is placed on the ground, the cross section may mean a surface when the convex or concave is cut in a direction parallel to the ground or perpendicular to the ground. The surface having the convex or concave shape of the pattern layer of the decoration member according to the embodiment is characterized in that at least one of cross sections perpendicular to the ground has the asymmetric structure.

In the present specification, the "cross section of the asymmetric structure" means that a figure configured by a periphery of the cross section is a structure which does not have line symmetry or point symmetry. The line symmetry refers to a case where a property is shown in which when a predetermined figure is made to be symmetric around one straight line, the figure is overlapped. The point symmetry means a case where a symmetrical property is shown in which when a predetermined figure rotates at 180 degrees around one point, the predetermined figure completely overlaps with an original figure. Here, the periphery of the cross section of the asymmetric structure may be the straight line, a curved line, or a combination thereof.

In the present specification, the "convex shape" may comprise one or more "convex unit shapes" and the "concave shape" may comprise one or more "concave unit shapes". The convex unit shape or the concave unit shape means a shape comprising two inclined sides (a first inclined side and a second inclined side) and is not a shape comprising three or more inclined sides. Referring to FIG. 21, a convex shape P1 of a circle C1 has a convex unit shape comprising a first inclined side and a second inclined side. However, a convex shape contained in a circle C2 comprises two convex unit shapes. Each first inclined side may be defined as a left inclined side of the convex shape or the concave shape and each second inclined side may mean a right inclined side of the convex shape or the concave shape.

As described above, the decoration member may express the dichroism by the convex or concave having the cross section of the asymmetric structure included in the surface of the pattern layer. The dichroism means that different colors are observed depending on the viewing angle. In the case of the representation of the color, the color may be represented by CIE L*a*b* and the color difference may be defined using a distance $\Delta E*ab$ in the L*a*b* space. Specifically, the color difference is $\Delta E = \sqrt{\Delta L*^2 + \Delta a*^2 + \Delta b*^2}$ and an observer may not recognize the color difference within the range of $0 < \Delta E*ab < 1$ [Reference Document: Machine Graphics and Vision 20(4):383-411]. Accordingly, in the present specification, the dichroism may be defined as $\Delta E*ab > 1$.

In an embodiment of the present specification, the color expression layer has the dichroism of $\Delta E*ab > 1$. Specifically, the color difference $\Delta E*ab$ which is a distance in the space of L*a*b* on the color coordinates CIE L*a*b* of the color expression layer may be greater than one.

In an embodiment of the present specification, the decoration member has the dichroism of $\Delta E*ab > 1$. Specifically, the color difference $\Delta E*ab$ which is a distance in the space of L*a*b* on the color coordinates CIE L*a*b* in the entire decoration member may be greater than one.

FIG. 14 exemplarily illustrates a decoration member comprising a pattern layer according to an embodiment of the present specification (the substrate and a protective layer are not illustrated). The surface of the pattern layer has a shape in which a second convex P2 which is smaller in height than the convex is disposed between the convexes P1. Hereinafter, the convex described before the second convex may be called the first convex.

FIG. 15 illustrates an example of the decoration member comprising the pattern layer according to an embodiment of the present specification (the color expression layer is not illustrated). The surface of the pattern layer has a shape in which a tip portion (pointed portion) of the convex P1 further comprises a concave P3 is smaller in height than the convex. The decoration member may show an effect that an image color is slightly changed depending on the viewing angle.

In an embodiment of the present specification, the pattern layer may comprise the convex or concave shape and each shape may be arranged in an inverted structure.

FIG. 16 illustrates an example of the decoration member comprising the pattern layer according to an embodiment of the present specification. As illustrated in FIG. 16(a), the surface of the pattern layer may have a shape in which a plurality of convexes is arranged in the inverted structure at 180 degrees. Specifically, the surface of the pattern layer may comprise a first region C1 in which the second inclined surface has a larger inclined angle than the first inclined surface and a second region C2 in which the second inclined surface has a larger inclined angle than the first inclined surface. In one example, the convex included in the first region may be referred to as the first convex P1 and the convex included in the second region may be referred to as a fourth convex P4. The contents described in the items of the convex P1 may be similarly applied to the height, the width, and the inclined angles of the first and fourth convexes P1 and P4 and the angle formed by the first and second inclined surfaces. As illustrated in FIG. 16(b), one of the first region and the second region may correspond to an image or a logo, and the other region may correspond to a background part. The decoration member may show an effect that the color of the image or log is slightly changed depending on the viewing angle. Further, the decoration member may show a decoration effect that the colors of the image or logo part and a background part are seen exchanged according to the viewing direction.

In an embodiment of the present specification, each of the first region and the second region may comprise a plurality of convexes. The widths of the first and second regions and the numbers of convexes of the first and second regions may be appropriately adjusted by considering the size of a targeted image or the logo.

In the present specification, inclined angles a2 and a3 of the convex P1 may mean angles formed by inclined surfaces S1 and S2 of the convex P1 and a horizontal surface of the pattern layer. Unless particularly mentioned in the present specification, the first inclined surface in the drawing may be defined as the left inclined surface of the convex and the second inclined surface may mean the right inclined surface of the convex.

In an embodiment of the present specification, the cross section of the convex P1 of the pattern layer may have a polygonal shape and a columnar shape extending in one direction. In one example, the cross section of the convex P1 may be a triangle or have a shape further comprising a small concave at a tip (a pointed portion or a vertex portion) of the triangle.

In an embodiment of the present specification, an angle a1 formed between the first inclined surface S1 and the second inclined surface S2 may be in the range of 80 to 100 degrees. The angle a1 may be, specifically, 80 degrees or more, 83 degrees or more, 86 degrees or more, or 89 degrees or more, and may be 100 degrees or less, 97 degrees or less, 94 degrees or less, or 91 degrees or less. The angle may refer to an angle of a vertex formed between the first inclined surface and the second inclined surface. When the first inclined surface and the second inclined surface do not form the vertex with each other, the angle may mean an angle of a vertex in a state in which a vertex is formed by virtually extending the first inclined surface and the second inclined surface.

In an embodiment of the present specification, a difference between the inclination angle a2 of the first inclined surface and an inclination angle a3 of the second inclined surface of the convex P1 may be in the range of 30 to 70 degrees. The difference between the inclination angle a2 of the first inclined surface and the inclination angle a3 of the second inclined surface may be, for example, 30 degrees or more, 35 degrees or more, 40 degrees or more, or 45 degrees or more, and may be 70 degrees or less, 65 degrees or less, 60 degrees or less or 55 degrees or less. When the difference between the inclination angles of the first inclined surface and the second inclined surface is within the above range, it may be advantageous in terms of implementation of color representation according to a direction. That is, the dichroism may be shown larger.

In an embodiment of the present specification, the height H1 of the convex P1 may be 5 μm to 30 μm. If the height of the convex is within the above range, it may be advantageous in terms of production process. In the present specification, the height of the convex may mean the shortest distance between the highest portion and the lowest portion of the convex with respect to a horizontal plane of the pattern layer. In the description relating to the height of the convex, the same numerical range may be applied even to the depth of the concave described above.

In an embodiment of the present specification, the width W1 of the convex P1 may be 10 μm to 90 μm. If the width of the convex is within the above range, it may be advantageous in terms of process for processing and forming the pattern. The width W1 of the convex P1 may be, for example, 10 μm or more, 15 μm or more, 20 μm or more, or 25 μm or more, 90 μm or less, 80 μm or less, 70 μm or less, 60 μm or less, 50 μm or less, 40 μm or less, or 35 μm or less. Descriptions relating to this width may apply not only to the convexes, but also to the concaves described above.

In an embodiment of the present specification, an interval between the convexes P1 may be 0 μm to 20 μm. In the present specification, the interval between the convexes may mean the shortest distance between an end point of one convex and a start point of the other convex of two adjacent convexes. If the interval between the convexes is properly maintained, the decoration member should have a relatively bright color when viewed from an inclined surface having a larger inclination angle of the convex, and a phenomenon that the reflection area is dark due to shading may be improved. As described later, a second convex having a smaller height than the convex may exist between the convexes. Descriptions relating to this interval may apply not only to the convexes, but also to the concaves described above.

In an embodiment of the present specification, a height H2 of the second convex P2 may have a range of ⅕ to ¼ of the height H1 of the first convex P1. For example, a difference (H1−H2) between the heights of the first convex and the second convex may be 10 μm to 30 μm. The width W2 of the second convex may be 1 μm to 10 μm. The width W2 of the second convex may be specifically 1 μm or more, 2 μm or more, 3 μm or more, 4 μm or more, or 4.5 μm or more, and may be 10 μm or less, 9 μm or less, 8 μm or less, 7 μm or less, 6 μm or less, or 5.5 μm or less.

In an embodiment of the present specification, the second convex may have two inclined surfaces S3 and S4 having different inclination angles. An angle a4 formed between the two inclined surfaces of the second convex may be 20 degrees to 100 degrees. Specifically, the angle a4 may be 20 degrees or more, 30 degrees or more, 40 degrees or more, 50 degrees or more, 60 degrees or more, 70 degrees or more, 80 degrees or more, or 85 degrees or more, and may be 100 degrees or less or 95 degrees or less. A difference (a6−a5) between the inclination angles of both inclined surfaces of the second convex may be 0 to 60 degrees. The difference (a6−a5) of the inclination angle may be 0 degrees or more, 10 degrees or more, 20 degrees or more, 30 degrees or more, 40 degrees or more, or 45 degrees or more, and may be 60 degrees or less or 55 degrees or less. When the dimension of the second convex is within the above range, it may be advantageous in terms of increasing the inflow of light from the side having a large inclination angle to form a bright color.

In an embodiment of the present specification, the height H3 of the concave P3 may be 3 μm to 15 μm. The height H3 of the concave P3 may be specifically 3 μm or more, and may be 15 μm or less, 10 μm or less, or 5 μm or less. The concave may have two inclined surfaces S5 and S6 having different inclination angles. An angle a7 formed between the two inclined surfaces of the concave may be 20 degrees to 100 degrees. Specifically, the angle a7 may be 20 degrees or more, 30 degrees or more, 40 degrees or more, 50 degrees or more, 60 degrees or more, 70 degrees or more, 80 degrees or more, or 85 degrees or more, and may be 100 degrees or less or 95 degrees or less. A difference (a9−a8) between the inclination angles of both inclined surfaces of the concave may be 0 to 60 degrees. The difference (a9−a8) of the inclination angle may be 0 degrees or more, 10 degrees or more, 20 degrees or more, 30 degrees or more, 40 degrees or more, or 45 degrees or more, and may be 60 degrees or less or 55 degrees or less. When the dimension of the concave is in the above range, it may be advantageous in terms of adding color in a mirror surface.

In an embodiment of the present specification, the pattern layer comprises a convex shape, and the cross section of the convex shape comprises a first inclined side and a second inclined side, and the shapes of the first inclined side and the second inclined side are the same as or different from each other, and have straight or curved shapes, respectively.

FIG. 17 illustrates an example of the decoration member comprising the pattern layer according to an embodiment of the present specification. The cross section of the pattern layer has a convex shape, and the cross section of the convex comprises a first region D1 comprising the first inclined side and a second region D2 comprising the second inclined side. The first inclined side and the second inclined side have straight shapes. An angle c3 between the first inclined side and the second inclined side may be 75 degrees to 105 degrees, or 80 degrees to 100 degrees. An angle c1 between the first inclined side and the ground and an angle c2 between the second inclined side and the ground are different from each other. For example, a combination of c1 and c2 may be 20 degrees/80 degrees, 10 degrees/70 degrees or 30 degrees/70 degrees.

FIG. 18 illustrates an example of the decoration member comprising the pattern layer according to an embodiment of the present specification. The cross section of the pattern layer has a convex shape, and the cross section of the convex comprises a first region E1 comprising the first inclined side and a second region E2 comprising the second inclined side. At least one of the first inclined side and the second inclined side may have a curved shape. For example, both the first inclined side and the second inclined side may have curved shapes, the first inclined side may have a straight shape, and the second inclined side may have a curved shape. When the first inclined side has a straight shape and the second inclined side has a curved shape, the angle c1 may be greater than the angle c2. FIG. 18 illustrates that the first inclined side has a straight shape, and the second inclined side has a curved shape. The angle between the inclined side having a curved shape and the ground may be calculated from an angle formed by a straight line and the ground when an arbitrary straight line is drawn from a point where the inclined side meets the ground to a point where the first inclined side meets the second inclined side. The second inclined side having the curved shape may have a different degree of curvature according to the height of the pattern layer, and the curved line may have a radius of curvature. The radius of curvature may be 10 times or less smaller than the width (E1+E2) of the convex shape. FIG. 18(a) shows that the radius of curvature of the curve line is twice larger than the width of the convex shape, and FIG. 18(b) shows that the radius of curvature of the curved line is one time larger than the width of the convex shape. A ratio of a curvature portion E2 to the width (E1+E2) of the convex may be 90% or less. FIGS. 18(a) and 18(b) show that the ratio of the curvature portion E2 to the width (E1+E2) of the convex is 60%.

In an embodiment of the present specification, the cross section of the convex shape may have a polygonal shape of a triangle or quadrangle.

FIG. 19 illustrates an example of the decoration member comprising the pattern layer according to an embodiment of the present specification. The cross section of the pattern layer may have a convex shape, and the cross section of the convex shape may have a quadrangular shape. The quadrangular shape may be a general quadrangular shape, and is not particularly limited as long as the inclination angles of the inclined sides are different from each other. The quadrangular shape may be a form remained by partially cutting off a triangle. For example, the quadrangular shape may be a trapezoid which is a quadrangle in which a pair of facing sides are parallel to each other, or a quadrangular shape in which a pair of facing sides parallel to each other do not exist. The convex-shaped cross section comprises a first region F1 comprising a first inclined side, a second region F2 comprising a second inclined side, and a third region F3 comprising a third inclined side. The third inclined side may or not be parallel to the ground. For example, when the quadrangular shape is trapezoidal, the third inclined side is parallel to the ground. At least one of the first inclined side to the third inclined side may have a curved shape and the details of the curved shape are as described above. The length of the sum of F1+F2+F3 may be defined as the width of the convex shape, and the details of the width are as described above.

In an embodiment of the present specification, the pattern layer may comprise two or more convex shapes, and may further comprise a flat portion in a part or all between the convexes shapes.

FIG. 20 illustrates an example of the decoration member comprising the pattern layer according to an embodiment of the present specification. A flat portion may be included between convexes of the pattern layer. The flat portion means a region where no convex exists. Except that the pattern layer further comprises a flat portion, the description of other components (D1, D2, c1, c2, c3, the first inclined side and the second inclined side) is as described above. On the other hand, the length of the sum of D1+D2+G1 is defined as a pitch of the pattern, which has a difference from the width of the pattern described above.

In an embodiment of the present specification, the surface of the convex or the concave shape comprises two or more convex or the concave shapes. As such, dichroism can be made larger by having the surface of two or more convex or concave shapes. In this case, two or more convex or concave shapes may be a repeated form of the same shape, but different shapes may be included.

In an embodiment of the present specification, the convex or concave shape having the cross section of the asymmetric structure comprises two or more sides in which at least one cross section has different inclination angles, different degrees of curvature, or different shapes. For example, when two sides of sides constituting at least one cross section have different inclination angles, different degrees of bending, or different shapes, the convex or the concave has an asymmetrical structure.

In an embodiment of the present specification, the shape of the convex or the concave comprises a first inclined side and a second inclined side of which inclination angles of at least one cross-section are different from each other.

In the present specification, unless otherwise indicated, the "side" may be a straight line, but is not limited thereto, and all or part of sides may be curved. For example, the sides may comprise a structure such as a portion of an arc of a circle or ellipse, a wave structure, a zigzag structure, or the like.

In the present specification, when the side comprises a portion of an arc of a circle or an ellipse, the circle or ellipse may have a radius of curvature. The radius of curvature may be defined as a radius of the arc when an extremely short section of the curved line is converted into an arc.

In the present specification, unless otherwise indicated, the term "inclined side" means a side of which an angle between the side and the ground is more than 0 degrees and 90 degrees or less when the decoration member is placed on the ground. At this time, when the side is a straight line, the angle between the straight line and the ground may be measured. When the side comprises a curve line, when the decoration member is placed on the ground, an angle formed between the straight line connecting a point of the side closest to the ground and a point of the surface furthest from the ground at a shortest distance and the ground may be measured.

In the present specification, unless otherwise stated, an inclination angle is more than 0 degree and 90 degrees or less as an angle between a surface or side constituting the pattern layer and the ground, when the said decoration member is placed on the ground. Alternatively, the inclination angle may mean an angle formed between the ground and a segment (a'-b') generated when connecting a point a' where the surface or side of the pattern layer is in contact with the ground and a point b' where the surface or side of the pattern layer is furthest from the ground to each other.

In the present specification, unless otherwise stated, the degree of curvature refers to a degree of change in a slope of a tangent at successive points on the side or surface. The greater the change in the slope of the tangent at successive points on the side or surface, the greater the degree of curvature.

In the present specification, the convex may have a convex unit shape, and the concave may have a concave unit shape. The convex shape or the concave unit shape means a shape comprising two inclined sides (a first inclined side and a second inclined side) and is not a shape comprising three or more inclined sides. Referring to FIG. 21, a convex P1 of a circle C1 has a convex unit shape comprising a first inclined side and a second inclined side. However, a shape contained in a circle C2 comprises two convex unit shapes. The first inclined side may be defined as a left inclined side of the convex or the concave, and the second inclined side may mean a right inclined side of the convex or the concave.

In an embodiment of the present specification, an angle a1 formed between the first inclined side and the second inclined side may be in a range of 80 degrees to 100 degrees. The angle a1 may be, specifically, 80 degrees or more, 83 degrees or more, 86 degrees or more, or 89 degrees or more, and may be 100 degrees or less, 97 degrees or less, 94 degrees or less, or 91 degrees or less. The angle may refer to an angle of a vertex formed between the first inclined side and the second inclined side. When the first inclined side and the second inclined side do not form a vertex with each other, the angle may mean an angle of a vertex in a state in which a vertex is formed by virtually extending the first inclined side and the second inclined side.

In an embodiment of the present specification, a difference between the inclination angle a2 of the first inclined side and an inclination angle a3 of the second inclined side of the convex P1 may be in a range of 30 degrees to 70 degrees. The difference between the inclination angle a2 of the first inclined side and the inclination angle a3 of the second inclined side may be, for example, 30 degrees or more, 35 degrees or more, 40 degrees or more, or 45 degrees or more, and may be 70 degrees or less, 65 degrees or less, 60 degrees or less or 55 degrees or less. When the difference between the inclination angles of the first inclined side and the second inclined side is within the above range, it may be advantageous in terms of implementation of color representation according to a direction.

FIG. 22 exemplarily shows a pattern layer of a decoration member and a method of manufacturing the same according to an embodiment of the present specification. The cross section of the pattern layer may have a convex shape, and the cross section of the convex shape may have a shape in which a specific region of an ABO1 triangle shape is removed. The method of determining the specific region to be removed is as follows. The contents of inclination angles c1 and c2 are the same as described above.

1) Set any point P1 on an AO1 segment that divides the AO1 segment at a ratio of L1:L2.

2) Set any point P2 on a BO1 segment that divides the BO1 segment at a ratio of m1:m2.

3) Set any point O2 on a AB segment that divides the AB segment at a ratio of n1:n2.

4) Set any point P3 on an O1O2 segment that divides an O2O1 segment at a ratio of o1:o2.

In this case, the ratios of L1:L2, m1:m2, n1:n2 and o1:o2 may be the same as or different from each other, and each independently 1:1000 to 1000:1.

5) Remove an area formed by a polygon of P1O1P2P3.

6) Set a shape formed by a polygon of ABP2P3P1 as a cross section of the convex.

The pattern layer may be modified in various forms by adjusting the ratios of L1:L2, m1:m2, n1:n2 and o1:o2. For example, when the L1 and m1 increases, the height of the pattern may increase, and when the o1 increases, the height of the concave formed on the convex may decrease, and a position of the lowest point of the concave formed in the convex may be adjusted close to either of the inclined sides of the convex by adjusting a ratio of n1.

FIG. 23 exemplarily illustrates a pattern layer manufactured by the method of manufacturing the pattern layer of the decoration member of FIG. 22. When the ratios of L1:L2, m1:m2, and o1:o2 are all the same as each other, the cross section may have a trapezoidal shape. The heights ha and hb of the trapezoid may be varied by adjusting the ratio of L1:L2. For example, FIG. 23(a) shows a pattern layer manufactured when the ratio of L1:L2 is 1:1 and FIG. 23(b) shows a pattern layer manufactured when the ratio of L1:L2 is 2:1.

In an embodiment of the present specification, the convex or concave shape of the surface of the pattern layer may be a cone-shaped convex protruding out of the surface of the pattern layer or a cone-shaped concave recessed inside the surface of the pattern layer.

In an embodiment of the present specification, the cone shape comprises a shape of a cone, an elliptical cone, or a polypyramid. Here, the shape of the bottom surface of the polypyramid comprises a triangle, a square, and a star shape having five or more protruding points. According to an example, when the decoration member is placed on the ground, when the surface of the pattern layer has a cone-shaped convex shape, at least one of vertical cross sections of the convex shape with respect to the ground may have a triangular shape. According to another example, when the decoration member is placed on the ground, when the surface of the pattern layer has a cone-shaped concave shape, at least one of vertical cross sections of the concave shape with respect to the ground may have an inverse triangular shape.

In an embodiment of the present specification, the cone-shaped convex or the cone-shaped concave shape may have at least one cross section of an asymmetric structure. For example, when the cone-shaped convex or the cone-shaped concave is observed from the surface side of the convex or the concave shape, when two or less identical forms exist when rotating 360 degrees from the vertex of the cone, it is advantageous in expressing the dichroism. FIG. 24 shows the cone-shaped convex shape observed from the surface side of the convex shape, in which a) shows cone shapes having a symmetrical structure, and b) illustrates cone shapes of an asymmetric structure.

When the decoration member is placed on the ground, the cone shape of the symmetrical structure has a regular polygon of which a cross section (hereinafter, referred to as a horizontal cross section) in a direction horizontal to the ground is a circle or a length of each side is the same, and the vertex of the cone is a structure existing on a line perpendicular to the cross section of the center of gravity of the horizontal cross section for the ground. However, when viewed from the surface side of the cone-shaped convex or concave shape, a cone shape having a cross section of an asymmetric structure is a structure in which a position of the vertex of the cone exists on the vertical line of the point that is not the center of gravity of the horizontal cross section of the cone or a structure in which a horizontal cross section of the cone is a polygon or ellipse of an asymmetric structure. When the horizontal cross section of the cone is a polygon of an asymmetric structure, at least one of sides or angles of the polygon may be designed differently from other sides or angles.

For example, as illustrated in FIG. 25, the position of the vertex of the cone may be changed. Specifically, as shown in the first picture of FIG. 25, when the vertex of the cone is designed to be located on the vertical line of the center 01 of gravity of the horizontal cross section with respect to the ground of the cone when observed from the surface side of the con-shaped convex shape, four identical structures may be obtained when rotating at 360 degrees based on the vertex of the cone (4 fold symmetry). However, the symmetrical structure is broken by designing the vertices of the cone at a position 02 other than the center 01 of gravity of the horizontal cross section with respect to the ground. When a length of one side of the horizontal cross section with respect to the ground is x, moving distances of vertexes of the cone are a and b, a height of the cone shape which is a length of the line connected vertically from the vertex 01 or 02 of the cone to the horizontal cross section with respect to the ground is h, and an angle formed between the horizontal cross section and the side surface of the cone is θn, a cosine value may be obtained as described below with respect to surfaces 1, 2, 3 and 4 of FIG. 25.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

At this time, since θ1 and θ2 are the same, there is no dichroism. However, since θ3 and θ4 are different from each other, and |θ3−θ4| means a color difference ΔE*ab between two colors, dichroism may be exhibited. Here, |θ3−θ4|>0. As such, by using the angle between the horizontal cross section and the side surface of the ground of the cone, it is possible to quantitatively indicate how the symmetrical structure is broken, that is, the degree of asymmetry, and the numerical value representing the degree of asymmetry is proportional to the color difference of the dichroism.

FIG. 26 shows a surface of which the highest point has a linear convex shape, in which a) illustrates a pattern having convexes that do not express dichroism, and b) shows a pattern having convexes expressing dichroism. A cross section X-X' of FIG. 26 a) is an isosceles triangle or an equilateral triangle, and a cross section Y-Y' of FIG. 26 b) is a triangle having different side lengths.

In an embodiment of the present specification, the pattern layer has a surface of which the highest point has a linear convex shape or the lowest point has a linear concave shape. The linear shape may be a straight line form, and a curved line form, may comprise both a curved line and a straight line, or may be a zigzag shape. This is illustrated in FIGS. 27 to 29. When the surface of which the highest point has a linear convex shape or the lowest point has a linear concave shape is viewed from the surface side of the convex or concave shape, it is advantageous to express dichroism when there is only one identical form when rotating 360 degrees based on the center of gravity of the horizontal cross section with respect to the ground of the convex or the concave.

In an embodiment of the present specification, the pattern layer has a convex or concave-shaped surface of a structure in which the tip of the cone shape is cut off. FIG. 30 shows a photograph embodying an inverted trapezoidal concave with an asymmetrical cross section perpendicular to the ground when the decoration member is placed on the ground. Such asymmetric cross section may be trapezoidal or inverted trapezoidal form. Even in this case, dichroism may be expressed by the cross section of an asymmetric structure.

In addition to the structure illustrated above, various convex or concave-shaped surfaces as shown in FIG. 31 may be implemented.

In the present specification, unless otherwise indicated, the "surface" may be a flat surface, but is not limited thereto, and all or part of surfaces may be a curved surface. For example, the surfaces may comprise a shape of the cross section in the vertical direction to the surface is a part of an arc of a circle or ellipse, a wave structure, a zigzag structure, or the like.

In an embodiment of the present specification, the pattern layer comprises a pattern of a symmetrical structure. The symmetrical structure comprises a prismatic structure, a lenticular lens structure, and the like.

In an embodiment of the present specification, the decoration member comprises a pattern layer comprising a convex or concave shape having a cross section having an asymmetrical structure on a surface of the light absorption layer facing the light reflection layer; between the light absorption layer and the light reflection layer; or on a surface of the light reflection layer facing the light absorption layer.

In an embodiment of the present specification, the pattern layer may have a flat portion on a surface opposite to the surface where the convex or concave shape is formed, and the flat portion may be formed on a substrate. A plastic substrate may be used as the substrate layer. Examples of the plastic substrate may comprise triacetyl cellulose (TAC); cyclo olefin copolymer (COP) such as norbornene derivatives; poly(methyl methacrylate (PMMA); polycarbonate (PC); polyethylene (PE); polypropylene (PP); polyvinyl alcohol (PVA); diacetyl cellulose (DAC); polyacrylate (Pac); poly ether sulfone (PES); polyetheretherketon (PEEK); polyphenylsulfone (PPS); polyetherimide (PEI); polyethylenenaphthatlate (PEN); polyethyleneterephtalate (PET); polyimide (PI); polysulfone (PSF); polyarylate (PAR) or an amorphous fluorine resin, etc., but are not limited thereto.

In an embodiment of the present specification, the pattern layer may comprise a thermosetting resin or an ultraviolet curable resin. A photocurable resin or a thermosetting resin may be used as the curable resin. An ultraviolet curable resin may be used as the photocurable resin. As the thermosetting resin, for example, silicone resin, silicon resin, fran resin, polyurethane resin, epoxy resin, amino resin, phenol resin, urea resin, polyester resin, melamine resin, etc. may be used, but is not limited thereto. The ultraviolet curable resin may typically comprise acrylic polymers such as polyester acrylate polymers, polystyrene acrylate polymers, epoxy acrylate polymers, polyurethane acrylate polymers or polybutadiene acrylate polymers, silicone acrylate polymers or alkyl acrylate polymers, etc., but is not limited thereto.

In an embodiment of the present specification, a color dye may be further included inside or on at least one surface of the pattern layer. The comprising of the color dye on at least one surface of the pattern layer may mean, for example, a case where the color dye is included in the above-described substrate layer provided on a flat portion side of the pattern layer.

In an embodiment of the present specification, the color dye may comprise anthraquinone-based dyes, phthalocyanine-based dyes, thioindigo-based dyes, perinone-based dyes, isoxindigo dyes, methane-based dyes, monoazo-based dyes, and 1:2 metal complex-based dyes.

In an embodiment of the present specification, when the pattern layer comprises a color dye therein, a dye may be added and applied to the curable resin. When a color dye is further included in the lower portion of the pattern layer, coating a layer containing the dye on the upper or lower portion of the substrate layer may be applied.

In an embodiment of the present specification, the content of the color dye may be, for example, 0 to 50 wt %. The content of the color dye may determine the transmittance and haze range of the pattern layer and the decoration member, the transmittance may be, for example, 20% to 90%, and the haze may be, for example, 1% to 40%.

In an embodiment of the present specification, the color expression layer may impart a metallic texture and a depth effect of color when viewing the decoration member. The color expression layer may be displayed in various colors according to a viewing angle of an image of the decoration member. This is because a wavelength of light passing through the pattern layer and reflected from the surface of an inorganic layer is changed according to a wavelength of the incident light.

The color expression layer may have the same convex or concave as the surface of the pattern layer described above. The color expression layer may have the same slope as the surface of the pattern layer described above.

In an embodiment of the present specification, the decoration member comprises a protective layer provided between the substrate and the color expression layer; on a surface of the color expression layer facing the substrate; or on a surface of the substrate facing the color expression layer.

In an embodiment of the present specification, the decoration member comprises a protective layer provided on at least one of between the substrate and the pattern layer, between the pattern layer and the light reflection layer, between the light reflection layer and the light absorption layer, and an opposite surface of the surface of the light absorption layer facing the light reflection layer. That is, the protective layer serves to protect the decoration member by being provided between the respective layers of the decoration member or at the outermost side of the decoration member.

In the present specification, the "protective layer" means a layer capable of protecting other layers of the decoration member, unless otherwise defined. For example, the inorganic layer may be prevented from deteriorating in a moisture or heat resistant environment. Alternatively, scratching of the inorganic layer or the pattern layer due to external factors may be effectively suppressed, so that the dichroism of the decoration member may be effectively expressed.

In the present specification, the term "inorganic layer" means a light absorption layer or a light reflection layer, unless otherwise defined.

In the present specification, an example of a decoration member structure comprising the protective layer is as follows.

For example, the decoration member may have a structure of substrate/protective layer/pattern layer/light reflection layer/light absorption layer/protective layer or substrate/protective layer/pattern layer/light absorption layer/light reflection layer/protective layer.

In an embodiment of the present specification, the protective layer comprises aluminum oxynitride. Since the protective layer comprises aluminum oxynitride (AlON), a function of the protective layer to be described later may be increased as compared with a case where the protective layer does not comprise aluminum oxynitride (AlON). In addition, when adjusting a ratio of each element of aluminum oxynitride, the protective function may be further improved.

In an embodiment of the present specification, the decoration member further comprises a protective layer, so that damage to the pattern layer and the inorganic layer is suppressed even when left in a high temperature and high humidity environment, and thus an excellent decorative effect may be maintained even in a poor environment.

The decoration member of the present specification may be applied to a known object in need of application. For example, the present invention may be applied to portable electronic devices, electronic products, cosmetic containers, furniture, building materials, and the like without limitation.

The method of applying the decoration member to portable electronic devices, electronic products, cosmetic containers, furniture, building materials, and the like is not particularly limited, and a known method known as a method of applying a decoration film in the art may be applied. The decoration member may further comprise an adhesive layer as necessary. In another example, the decoration member may be applied to portable electronic devices or electronic products by direct coating. In this case, a separate adhesive layer for attaching the decoration member to portable electronic devices or electronic products may not be required. In another example, the decoration member may be attached to portable electronic devices or electronic products through the adhesive layer. The adhesive layer may use an optically clear adhesive tape (OCA tape) or an adhesive resin. The OCA tape or the adhesive resin may apply OCA tapes or adhesive resins known in the art without limitation. If necessary, a release liner for protecting the adhesive layer may be further provided.

In an embodiment of the present specification, the light reflection layer and the light absorption layer may be formed on the substrate or a pattern of the pattern layer of the substrate by a sputter method, an evaporation method, a vapor deposition method, chemical vapor deposition (CVD), wet coating, or the like, respectively. In particular, since the sputtering method is straight, it is possible to maximize a difference in deposition thickness of both inclined surfaces of the convex by tilting a position of a target.

In an embodiment of the present specification, the light reflection layer and the light absorption layer may be formed by a reactive sputtering method, respectively. The reactive sputtering is a method in which energetic ions (e.g., $Ar^+$) apply shocks a target material and a target material released at this time is deposited on the surface to be deposited. In this case, the base pressure may be $1.0 \times 10^{-5}$ Torr or less, $6.0 \times 10^{-6}$ Torr or less, preferably $3.0 \times 10^{-6}$ Torr or less.

In an embodiment of the present specification, the reactive sputtering method may be performed in a chamber containing plasma gas and reactive gas. The plasma gas may be argon (Ar) gas. In addition, the reactive gases required for forming the inorganic layer are oxygen ($O_2$) and nitrogen ($N_2$), which are gases for providing oxygen or nitrogen atoms, and are distinguished from plasma gases.

In an embodiment of the present specification, a flow rate of the plasma gas may be 10 sccm or more and 300 sccm or less, preferably 20 sccm or more and 200 sccm or less. The sccm means Standard Cubic Centimeter Per minute.

In an embodiment of the present specification, a process pressure p1 in the chamber may be 1.0 mTorr to 10.0 mTorr, preferably 1.5 mTorr to 10.0 mTorr. If the process pressure is higher than the above range during sputtering, Ar particles present in the chamber increase, and particles released from the target collide with the Ar particles to lose energy, thereby decreasing the growth rate of the thin film. On the other hand, if the process pressure is maintained too low, the energy loss of copper nickel oxide particles by Ar particles is reduced, but there is a disadvantage that the particles having high energy may damage the substrate or deteriorate the quality of the protective layer.

In an embodiment of the present specification, a fraction of the reactive gas to the plasma gas may be 30% or more and 70% or less, preferably 40% or more and 70% or less, and more preferably 50% or more and 70% or less. The fraction of the reactive gas may be calculated as ($Q_{reactive\ gas}/Q_{plasma\ process\ gas}$)*100%). The $Q_{reactive\ gas}$ means a flow rate of the reactive gas in the chamber and $Q_{plasma\ process\ gas}$ may be a flow rate of the plasma process gas in the chamber. When the numerical range is satisfied, an atomic ratio of the copper nickel oxide described above may be adjusted to a desired range.

In an embodiment of the present specification, the driving power of the reactive sputtering method may be 100 W or more and 500 W or less, preferably 150 W or more and 300 W or less.

In an embodiment of the present specification, the voltage applied in the reactive sputtering method may be in a range of 350 V or more and 500 V. The range of the voltage may be adjusted according to the state of the target, the process pressure, the driving power (process power) or the fraction of the reactive gas.

In an embodiment of the present specification, a deposition temperature of the reactive sputtering method may be 20° C. or more and 300° C. or less. When deposited at a temperature lower than the above range, there is a problem in that the crystallinity of the thin film growth is deteriorated due to insufficient energy necessary for crystal growth of particles released from the target and arriving at the substrate. At a temperature higher than the above range, there is a problem in that the particles released from the target are evaporated or re-evaporated and thus the thin film growth rate is deteriorated.

Mode for Invention

Hereinafter, this application will be described in detail with reference to Examples, but the scope of the present specification is not limited by the following Examples.

EXAMPLES AND COMPARATIVE EXAMPLES

Example 1

An ultraviolet curable resin was applied onto a PET substrate to form a prism-shaped pattern layer having an inclination angle of 20 degrees/70 degrees. Thereafter, a color expression layer comprising a light absorption layer and a light reflection layer was formed on the patterned layer by using reactive sputtering.

Specifically, reactive sputtering was used, and a copper and nickel target (target weight ratio wt % was Cu:Ni=98:2) was used. The flow rate of argon gas was 35 sccm, the flow rate of oxygen gas was adjusted to 15 sccm, the process pressure was 9 mTorr, and the power was maintained at 200 W. Through this, a light absorption layer of 10 nm having a composition of Table 2 was formed. Then, In of a thickness of 70 nm was deposited on the light absorption layer by sputtering to form a light reflection layer, thereby manufacturing a final decoration member.

Example 2

A decoration member was manufactured in the same manner as in Example 1 except that the thickness of a light absorption layer was adjusted to 20 nm.

Example 3

A decoration member was manufactured in the same manner as in Example 1 except that the thickness of a light absorption layer was adjusted to 30 nm.

Comparative Example 1

A decoration member was manufactured in the same manner as in Example 1 except that the thickness of a light absorption layer was adjusted to 40 nm.

Comparative Example 2

A decoration member was manufactured in the same manner as in Example 1 except that the thickness of a light absorption layer was adjusted to 50 nm.

Comparative Example 3

A decoration member was manufactured in the same manner as in Example 1 except that the thickness of a light absorption layer was adjusted to 60 nm.

Example 4

A decoration member was manufactured in the same manner as in Example 1 except that a target weight ratio wt % of copper and nickel was changed to Cu:Ni=69:31.

Example 5

A decoration member was manufactured in the same manner as in Example 4 except that the thickness of a light absorption layer was adjusted to 20 nm.

Example 6

A decoration member was manufactured in the same manner as in Example 4 except that the thickness of a light absorption layer was adjusted to 30 nm.

Comparative Example 4

A decoration member was manufactured in the same manner as in Example 4 except that the thickness of a light absorption layer was adjusted to 40 nm.

Comparative Example 5

A decoration member was manufactured in the same manner as in Example 4 except that the thickness of a light absorption layer was adjusted to 50 nm.

Comparative Example 6

A decoration member was manufactured in the same manner as in Example 4 except that the thickness of a light absorption layer was adjusted to 60 nm.

Example 7

A decoration member was manufactured in the same manner as in Example 1 except that a target weight ratio wt % of copper and nickel was changed to Cu:Ni=29:71.

Example 8

A decoration member was manufactured in the same manner as in Example 7 except that the thickness of a light absorption layer was adjusted to 20 nm.

Example 9

A decoration member was manufactured in the same manner as in Example 7 except that the thickness of a light absorption layer was adjusted to 30 nm.

Comparative Example 7

A decoration member was manufactured in the same manner as in Example 7 except that the thickness of a light absorption layer was adjusted to 40 nm.

Comparative Example 8

A decoration member was manufactured in the same manner as in Example 7 except that the thickness of a light absorption layer was adjusted to 50 nm.

Comparative Example 9

A decoration member was manufactured in the same manner as in Example 7 except that the thickness of a light absorption layer was adjusted to 60 nm.

TABLE 2

| | Thickness of light absorption layer ($T_1$) | Thickness parameter Tx (Equation 2) | Component ratio at each position (Cu$_a$Ni$_b$O$_x$) | | | $\sigma_x$ (Equation 3) | $\omega$ value (Equation 1) |
|---|---|---|---|---|---|---|---|
| | | | a ($*10^{-2}$) | b ($*10^{-2}$) | c ($*10^{-2}$) | | |
| Example 1 | 10 | 0.167 | 0.51 | 0.01 | 0.48 | 1.3 | 0.217 |
| Example 2 | 20 | 0.333 | 0.51 | 0.01 | 0.48 | 1.3 | 0.433 |
| Example 3 | 30 | 0.5 | 0.51 | 0.01 | 0.48 | 1.3 | 0.65 |
| Comparative Example 1 | 40 | 0.667 | 0.51 | 0.01 | 0.48 | 1.3 | 0.867 |
| Comparative Example 2 | 50 | 0.833 | 0.51 | 0.01 | 0.48 | 1.3 | 1.083 |
| Comparative Example 3 | 60 | 1 | 0.51 | 0.01 | 0.48 | 1.3 | 1.3 |
| Example 4 | 10 | 0.167 | 0.3 | 0.2 | 0.5 | 1.2 | 0.2 |
| Example 5 | 20 | 0.333 | 0.3 | 0.2 | 0.5 | 1.2 | 0.4 |
| Example 6 | 30 | 0.5 | 0.3 | 0.2 | 0.5 | 1.2 | 0.6 |
| Comparative Example 4 | 40 | 0.667 | 0.3 | 0.2 | 0.5 | 1.2 | 0.8 |
| Comparative Example 5 | 50 | 0.833 | 0.3 | 0.2 | 0.5 | 1.2 | 1 |
| Comparative Example 6 | 60 | 1 | 0.3 | 0.2 | 0.5 | 1.2 | 1.2 |
| Example 7 | 10 | 0.167 | 0.15 | 0.33 | 0.52 | 1.11 | 0.185 |
| Example 8 | 20 | 0.333 | 0.15 | 0.33 | 0.52 | 1.11 | 0.37 |
| Example 9 | 30 | 0.5 | 0.15 | 0.33 | 0.52 | 1.11 | 0.555 |

TABLE 2-continued

| | Thickness of light absorption layer ($T_1$) | Thickness parameter Tx (Equation 2) | Component ratio at each position (CuaNibOx) | | | $\sigma_x$ (Equation 3) | $\omega$ value (Equation 1) |
|---|---|---|---|---|---|---|---|
| | | | a (*$10^{-2}$) | b (*$10^{-2}$) | c (*$10^{-2}$) | | |
| Comparative Example 7 | 40 | 0.667 | 0.15 | 0.33 | 0.52 | 1.11 | 0.74 |
| Comparative Example 8 | 50 | 0.833 | 0.15 | 0.33 | 0.52 | 1.11 | 0.925 |
| Comparative Example 9 | 60 | 1 | 0.15 | 0.33 | 0.52 | 1.11 | 1.11 |

Evaluation Example (Color Evaluation)

The component ratios of the decoration members manufactured in Examples and Comparative Examples were analyzed, and colors shown for each thickness were observed and recorded in Table 3 below.

TABLE 3

| | Lch coordinates | | | |
|---|---|---|---|---|
| | L | c | h | Color |
| Example 1 | 69 | 78 | 71 | Warm tone |
| Example 2 | 54 | 59 | 54 | |
| Example 3 | 27 | 52 | 2 | |
| Comparative Example 1 | 64 | 1 | 270 | Cool tone |
| Comparative Example 2 | 35 | 25 | 299 | |
| Comparative Example 3 | 53 | 11 | 264 | |
| Example 4 | 62 | 15 | 74 | Warm tone |
| Example 5 | 56 | 35 | 50 | |
| Example 6 | 30 | 31 | 27 | |
| Comparative Example 4 | 47 | 10 | 240 | Cool tone |
| Comparative Example 5 | 16 | 26 | 283 | |
| Comparative Example 6 | 34 | 20 | 246 | |
| Example 7 | 62 | 15 | 74 | Warm tone |
| Example 8 | 58 | 36 | 54 | |
| Example 9 | 33 | 35 | 34 | |
| Comparative Example 7 | 45 | 11 | 243 | Cool tone |
| Comparative Example 8 | 15 | 27 | 303 | |
| Comparative Example 9 | 30 | 21 | 250 | |

In the case of the decoration members of Comparative Examples 1 to 9, a cool tone was shown, whereas in the case of the decoration members of Examples 1 to 9, a warm tone was shown.

When comparing Examples and Comparative Examples, even if the compositions of the light absorption layers were the same as each other, it was confirmed that a warm or cool tone was shown when the thickness was changed.

The invention claimed is:

1. A decoration member comprising:
a color expression layer comprising a light reflection layer and a light absorption layer provided on the light reflection layer; and
a substrate provided on one surface of the color expression layer,
wherein the light absorption layer comprises a copper nickel oxide ($Cu_aNi_bO_x$), and $\omega$ represented by Equation 1 is in a range of 0.001 to 0.7 when a component analysis is performed with respect to any one point of the light absorption layer:

$$\omega = (T_x) \times (\sigma_x) \quad \text{[Equation 1]}$$

$$f(T_1) = \frac{T_1}{T_0} (0 < T_1 \leq T_0) \quad \text{[Equation 2]}$$

$$f(T_1) = f(T_1 + n \times T_0)$$

$$\sigma_x = \frac{a+b}{x} \times 1.2 \quad \text{[Equation 3]}$$

wherein, in Equations 1 and 2, $T_x$ represents a function value depending on $T_1$ of a function represented by the $f(T_1)$, which is a ratio of a thickness of the light absorption layer comprising the any one point in which the component analysis is performed ($T_1$) to a predetermined period $T_0$ of the thickness of the light absorption layer, n represents a positive integer of 1 or more, and $\sigma_x$ is represented by Equation 3, wherein, in Equation 2, $T_0$ is 60 nm, and wherein, in Equation 3, a means an element content ratio of copper (Cu), b means an element content ratio of nickel (Ni), and x means an element content ratio of oxygen (O).

2. The decoration member of claim 1, wherein $T_x$ is in a range of 0.01 to 0.5.

3. The decoration member of claim 1, wherein $\sigma_x$ is in a range of 0.1 to 5.

4. The decoration member of claim 1, wherein a Hue-angle h* in CIE LCh color space of the light absorption layer is in a range of 315 to 360° and 0 to 150°.

5. The decoration member of claim 1, wherein the light reflection layer is constituted by a single layer or multiple layers comprising one or more types of materials selected from the group consisting of indium (In), titanium (Ti), and tin (Sn), silicon (Si), germanium (Ge), aluminum (Al), copper (Cu), nickel (Ni), vanadium (V), tungsten (W), tantalum (Ta), molybdenum (Mo), neodymium (Nb), hon (Fe), chromium (Cr), cobalt (Co), gold (Au), and silver (Ag); an oxide, nitride, or an oxynitride thereof; carbon and a carbon composite.

6. The decoration member of claim 1, wherein the light absorption layer has a refractive index of 0 to 8 at a wavelength of 400 nm.

7. The decoration member of claim 1, wherein the light absorption layer has an extinction coefficient of greater than 0 and less than or equal to 4 at a wavelength of 400 nm.

8. The decoration member of claim 1, wherein the light absorption layer comprises two or more points having different thicknesses.

9. The decoration member of claim 1, wherein the color expression layer further comprises a color film.

10. The decoration member of claim 1, wherein the color expression or the substrate comprises a pattern layer.

11. The decoration member of claim 10, wherein the pattern layer comprises a convex or concave shape having a cross section having an asymmetric structure.

12. The decoration member of claim 1, wherein the decoration member expresses dichroism.

13. The decoration member of claim 1, wherein the substrate comprises a plastic injection molding or a glass substrate for a cosmetic case.

14. The decoration member of claim 13, wherein the plastic injection molding comprises at least one of polypropylene (PP), polystyrene (PS), polyvinylacetate (PVAc), polyacrylate, polyethylene terephthalate (PET), polyvinyl chloride (PVC), polymethyl methacrylate (PMMA), ethylene-vinyl acetate copolymer (EVA), polycarbonate (PC), polyamide, and styrene-acrylonitrile copolymer (SAN).

* * * * *